United States Patent
Kawashima et al.

(10) Patent No.: US 9,178,075 B2
(45) Date of Patent: *Nov. 3, 2015

(54) THIN-FILM SEMICONDUCTOR DEVICE AND METHOD FOR MANUFACTURING THE SAME

(75) Inventors: Takahiro Kawashima, Osaka (JP); Hisao Nagai, Osaka (JP); Eiichi Satoh, Hyogo (JP); Yuji Kishida, Hyogo (JP); Genshiro Kawachi, Chiba (JP)

(73) Assignees: PANASONIC LIQUID CRYSTAL DISPLAY CO., LTD., Hyogo (JP); JOLED INC., Tokyo (JP)

( * ) Notice: Subject to any disclaimer, the term of this patent is extended or adjusted under 35 U.S.C. 154(b) by 54 days.

This patent is subject to a terminal disclaimer.

(21) Appl. No.: 13/984,931

(22) PCT Filed: Feb. 27, 2012

(86) PCT No.: PCT/JP2012/001332
§ 371 (c)(1), (2), (4) Date: Aug. 12, 2013

(87) PCT Pub. No.: WO2012/117718
PCT Pub. Date: Sep. 7, 2012

(65) Prior Publication Data
US 2013/0320339 A1    Dec. 5, 2013

(30) Foreign Application Priority Data
Feb. 28, 2011 (WO) .................. PCT/JP2011/001157

(51) Int. Cl.
*H01L 29/02* (2006.01)
*H01L 29/786* (2006.01)
*H01L 29/66* (2006.01)

(52) U.S. Cl.
CPC .... *H01L 29/78693* (2013.01); *H01L 29/66742* (2013.01); *H01L 29/66765* (2013.01); *H01L 29/78678* (2013.01)

(58) Field of Classification Search
CPC ......... H01L 29/12; H01L 29/66; H01L 29/78; H01L 29/78696; H01L 29/7869; H01L 29/66765; H01L 29/78678; H01L 29/78669
USPC .......................... 257/43, 57, E21.09, 29.068
See application file for complete search history.

(56) References Cited

U.S. PATENT DOCUMENTS 5,567,633 A    10/1996 Gosain et al.
5,728,610 A    3/1998 Gosain et al.
(Continued)

FOREIGN PATENT DOCUMENTS

JP    7-273347    10/1995
JP    2000-066242    3/2000
(Continued)

OTHER PUBLICATIONS

U.S. Appl. No. 13/940,643 to Hiroshi Hayashi et al., filed Jul. 12, 2013.
(Continued)

*Primary Examiner* — Michael Lebentritt
(74) *Attorney, Agent, or Firm* — Greenblum & Bernstein, P.L.C.

(57) ABSTRACT

A thin-film semiconductor device includes a gate electrode formed above a substrate; a gate insulating film formed to cover the gate electrode; a semiconductor layer formed above the gate insulating film and having a channel region; a channel protective layer formed above the semiconductor layer and containing an organic material which includes silicon, oxygen, and carbon; an interfacial layer which is formed in contact with the channel protective layer between the semiconductor layer and the channel protective layer, and which includes carbon as a major component, the carbon originating from the organic material; and a source electrode and a drain electrode which are electrically connected to the semiconductor layer.

18 Claims, 33 Drawing Sheets

(56) References Cited

U.S. PATENT DOCUMENTS

| | | |
|---|---|---|
| 6,855,954 B1 | 2/2005 | Zhang |
| 7,601,994 B2 | 10/2009 | Fukuchi et al. |
| 7,642,038 B2 | 1/2010 | Fujii |
| 7,768,009 B2 | 8/2010 | Kobayashi et al. |
| 7,883,912 B2 | 2/2011 | Fukuchi et al. |
| 8,053,780 B2 | 11/2011 | Kanno et al. |
| 8,133,771 B2 | 3/2012 | Kobayashi et al. |
| 8,222,636 B2 | 7/2012 | Fujii |
| 8,324,027 B2 | 12/2012 | Yamazaki et al. |
| 8,389,993 B2 | 3/2013 | Kobayashi et al. |
| 8,441,011 B2 | 5/2013 | Yamazaki et al. |
| 8,518,728 B2 | 8/2013 | Kanno et al. |
| 2005/0221203 A1 | 10/2005 | Fujii |
| 2007/0057258 A1 | 3/2007 | Fukuchi et al. |
| 2007/0131976 A1 | 6/2007 | Kanno et al. |
| 2008/0119030 A1 | 5/2008 | Kunii |
| 2009/0057672 A1 | 3/2009 | Kobayashi et al. |
| 2009/0325333 A1 | 12/2009 | Fukuchi et al. |
| 2010/0044702 A1* | 2/2010 | Urayama et al. ............... 257/43 |
| 2010/0051943 A1 | 3/2010 | Fujii |
| 2010/0155719 A1 | 6/2010 | Sakata et al. |
| 2010/0188319 A1* | 7/2010 | Taniguchi et al. ............. 345/80 |
| 2010/0285624 A1 | 11/2010 | Kobayashi et al. |
| 2011/0006302 A1 | 1/2011 | Yamazaki et al. |
| 2011/0097830 A1 | 4/2011 | Kanno et al. |
| 2012/0129288 A1 | 5/2012 | Kobayashi et al. |
| 2013/0001559 A1 | 1/2013 | Kishida et al. |
| 2013/0026479 A1 | 1/2013 | Kawashima et al. |
| 2013/0030728 A1 | 1/2013 | Kawashima et al. |
| 2013/0037806 A1 | 2/2013 | Hayashi et al. |
| 2013/0049001 A1 | 2/2013 | Yamazaki et al. |
| 2013/0105797 A1 | 5/2013 | Hayashi et al. |
| 2013/0105798 A1 | 5/2013 | Kanegae et al. |
| 2013/0119391 A1 | 5/2013 | Kanegae et al. |
| 2013/0126869 A1 | 5/2013 | Kanegae et al. |
| 2013/0168678 A1* | 7/2013 | Hayashi et al. ................. 257/57 |
| 2013/0221350 A1 | 8/2013 | Yamazaki et al. |
| 2013/0277678 A1 | 10/2013 | Ootaka et al. |

FOREIGN PATENT DOCUMENTS

| | | |
|---|---|---|
| JP | 2001-119029 | 4/2001 |
| JP | 2004-006890 | 1/2004 |
| JP | 2004-158685 | 6/2004 |
| JP | 2005-165305 | 6/2005 |
| JP | 2005-167228 | 6/2005 |
| JP | 2005-311325 | 11/2005 |
| JP | 2008-103704 | 5/2008 |
| JP | 2008-124408 | 5/2008 |
| JP | 2009-076894 | 4/2009 |
| JP | 2010-166038 | 7/2010 |
| JP | 2011-029411 | 2/2011 |
| JP | 2011-035388 | 2/2011 |

OTHER PUBLICATIONS

U.S. Appl. No. 13/997,802 to Arinobu Kanegae et al., filed Jun. 25, 2013.

International Search Report (ISR) and Written Opinion (WO) in International Patent Application No. PCT/JP2012/001332, dated Apr. 10, 2012.

International Search Report (ISR) in International Patent Application No. PCT/JP2011/001157, dated Jun. 7, 2011.

* cited by examiner

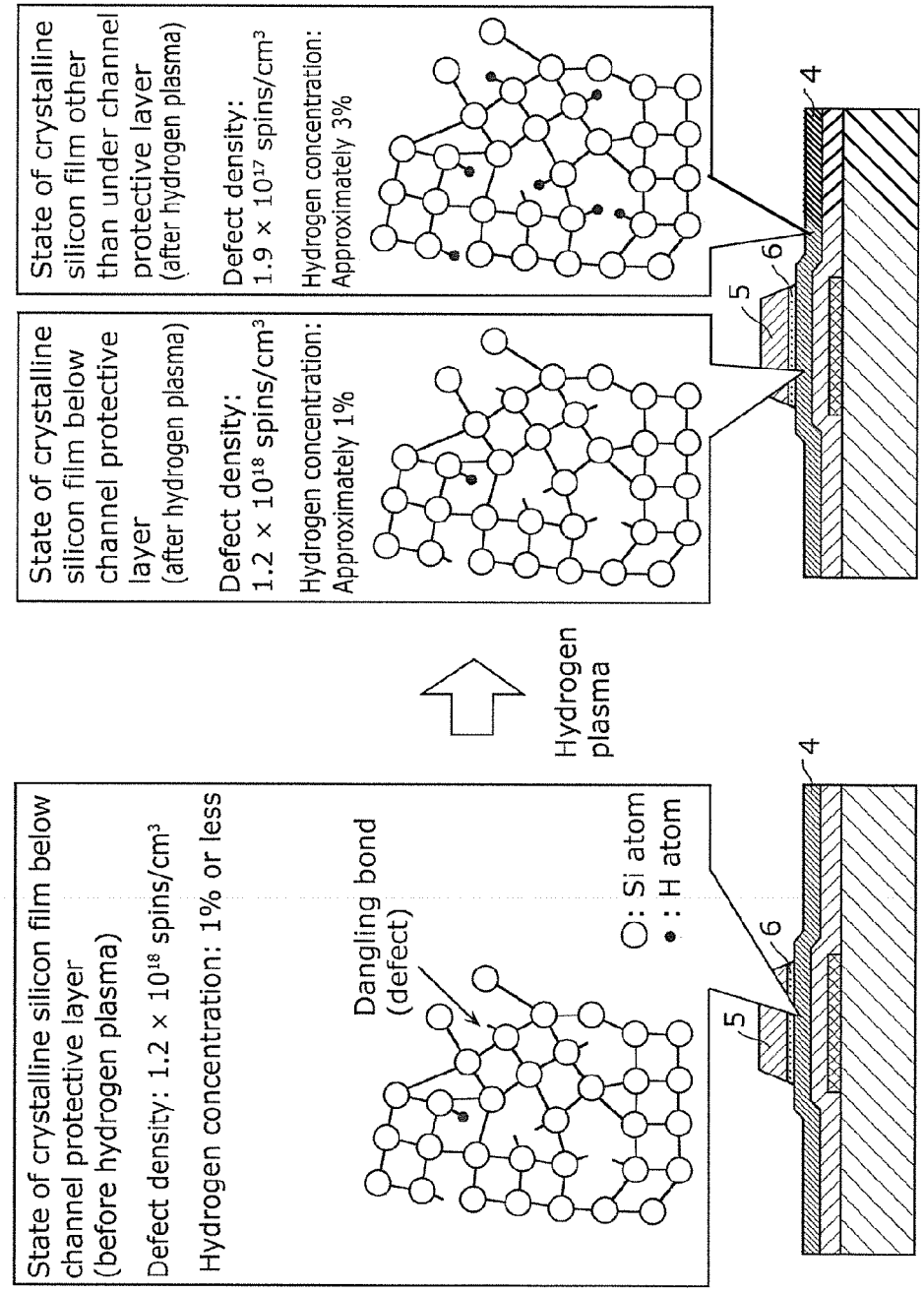

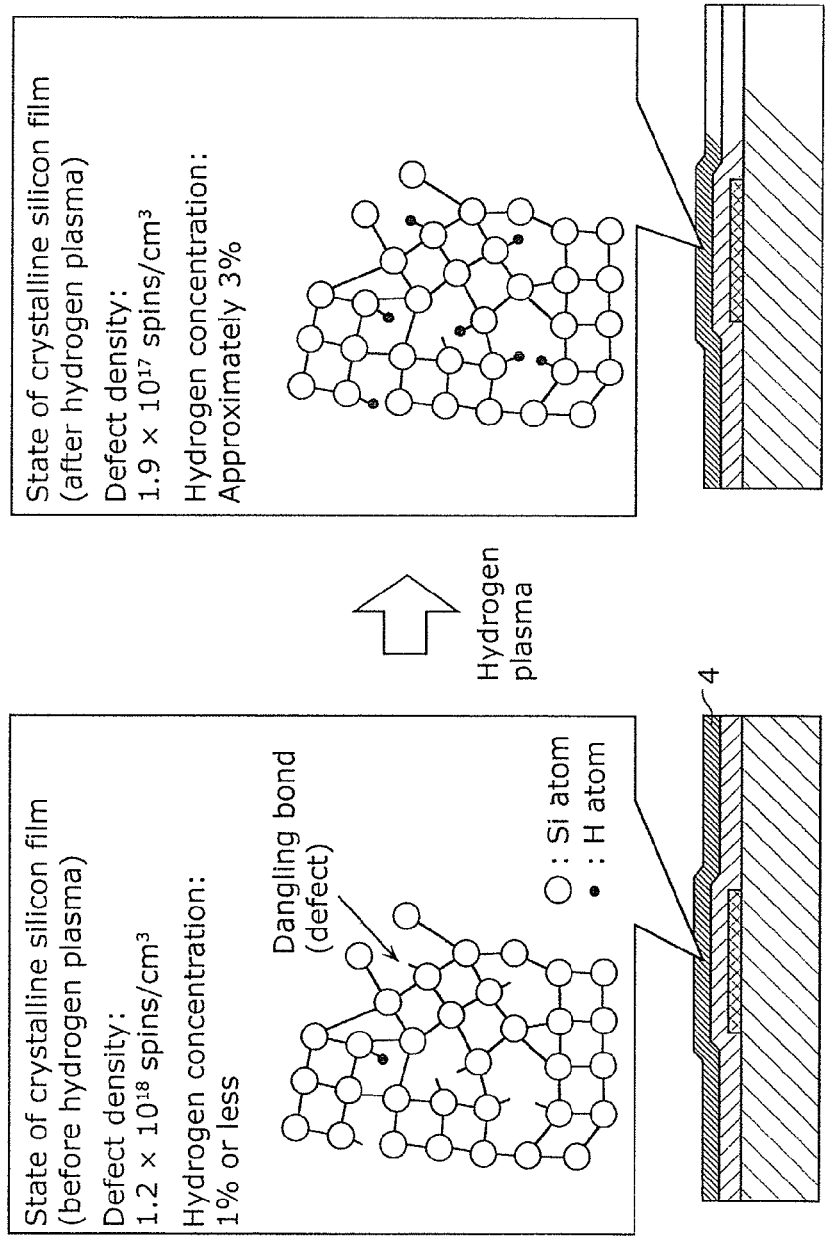

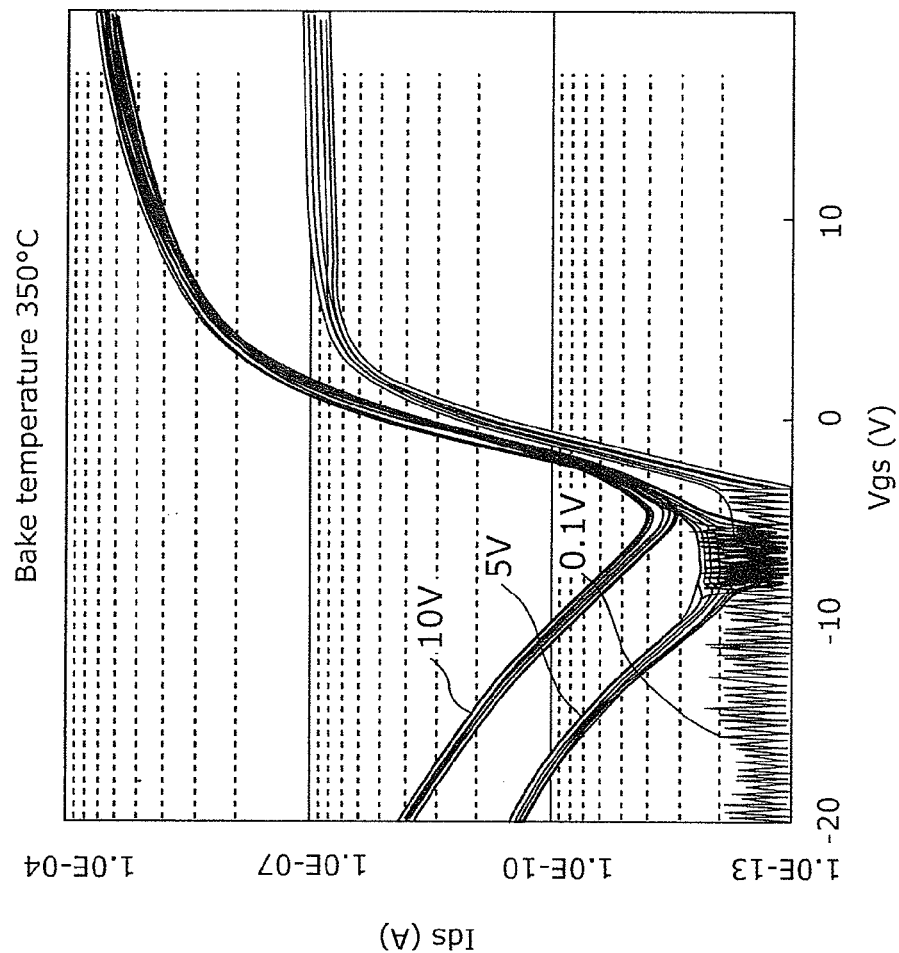

(a)

(b)

THIN-FILM SEMICONDUCTOR DEVICE AND METHOD FOR MANUFACTURING THE SAME

TECHNICAL FIELD

The present invention relates to thin-film semiconductor devices and methods for manufacturing the thin-film semiconductor devices, and particularly relates to a thin-film semiconductor device used in an active-matrix organic EL display device and a method for manufacturing the same.

BACKGROUND ART

Conventionally, in active-matrix flat-panel displays (FPD) such as liquid crystal displays or organic electroluminescence (EL) displays, thin-film semiconductor devices also referred to as thin-film transistors (TFT) have been used.

Generally, in the thin-film semiconductor device, as a TFT that can realize a low cost, a bottom-gate TFT is used where a gate electrode is located closer to the side of a substrate than a channel layer (semiconductor layer) (Patent Literature 1).

CITATION LIST

Patent Literature

[PTL1]
Japanese Unexamined Patent Application Publication No. 7-273347

SUMMARY OF INVENTION

Technical Problem

In recent years, along with enlargement and image resolution enhancement of display devices, TFT has been required to have high performance. Moreover, the performance of TFT is influenced by a layer disposed adjacent to a semiconductor layer.

The present invention has an object to devise the layer disposed adjacent to the semiconductor layer, and to provide high-performance thin-film semiconductor device and a method for manufacturing the thin-film semiconductor device.

Solution to Problem

In order to attain the above mentioned goal, an aspect of the thin-film semiconductor device according to the present invention comprises: a gate electrode formed above a substrate; a gate insulating film formed to cover the gate electrode; a semiconductor layer formed above the gate insulating film, the semiconductor layer having a channel region; a protective layer formed above the semiconductor layer, the protective layer containing an organic material which includes silicon, oxygen, and carbon; an interfacial layer formed in contact with the protective layer between the semiconductor layer and the protective layer, the interfacial layer including carbon as a major component, the carbon originating from the organic material; and a source electrode and a drain electrode which are electrically connected to the semiconductor layer.

Moreover, another aspect of the thin-film semiconductor device according to the present invention comprises: a gate electrode formed above a substrate; a gate insulating film formed to cover the gate-electrode; an oxide semiconductor layer formed above the gate insulating film, the oxide semiconductor layer having a channel region; a protective layer formed above a part of the oxide semiconductor layer, the protective layer containing an organic material; a source electrode and a drain electrode which are electrically connected to the oxide semiconductor layer, wherein a carrier concentration in a portion in which the protective layer is not formed above the oxide semiconductor layer is higher than a carrier concentration in a portion in which the protective layer is formed above the oxide semiconductor layer.

Advantageous Effects of Invention

The present invention makes it possible to provide high-performance thin-film semiconductor device and a method for manufacturing the high-performance semiconductor device.

BRIEF DESCRIPTION OF DRAWINGS

FIG. 7A is a diagram showing a state of a semiconductor layer before and after a hydrogen plasma treatment, when a channel protective layer is formed and then hydrogen plasma treatment is performed in the thin-film semiconductor device according to Embodiment 1 of the present invention.

FIG. 7B is a diagram showing a state of a semiconductor layer before and after hydrogen plasma treatment, when hydrogen plasma treatment is performed before a channel protective layer is formed in the thin-film semiconductor device according to Embodiment 1 of the present invention.

FIG. 8B is a diagram showing current-voltage characteristics of the thin-film semiconductor device at a bake temperature of 350° C.

DESCRIPTION OF EMBODIMENTS

Figure 1:
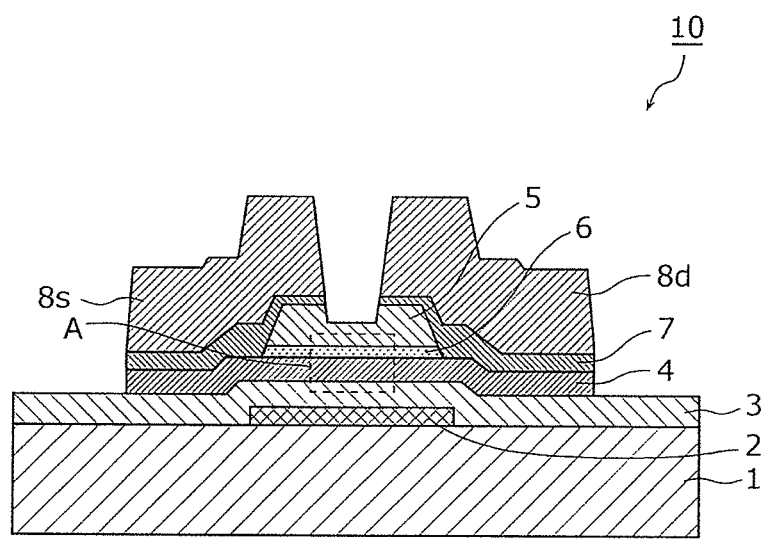
FIG. 1 is a cross-sectional view schematically illustrating a thin-film semiconductor device according to Embodiment 1 of the present invention.

A first aspect of the thin-film semiconductor device according to the present invention comprises: a gate electrode formed above a substrate; a gate insulating film formed to cover the gate electrode; an oxide semiconductor layer formed above the gate insulating film, the oxide semiconductor layer having a channel region; a protective layer formed above the oxide semiconductor layer, the protective layer containing an organic material which includes silicon, oxygen, and carbon; an interfacial layer formed in contact with the protective layer between the oxide semiconductor layer and the protective layer, the interfacial layer including carbon as a major component, the carbon originating from the organic material; and a source electrode and a drain electrode which are electrically connected to the oxide semiconductor layer.

According to the present aspect, it is possible to reduce oxygen deficiency in an oxide semiconductor layer in a channel region, and therefore it is possible to reduce degradation in TFT characteristics. Moreover, since the interfacial layer including carbon as a major component is formed between the oxide semiconductor layer and the protective layer, it is possible to further reduce oxygen deficiency in the oxide semiconductor layer in the channel region. Furthermore, since it is possible to reduce excessive carbon diffusion from the protective layer, it is possible to reduce an impurity state in the oxide semiconductor. Therefore, it is possible to provide a thin-film semiconductor device which reduces leakage current at the time of OFF.

Furthermore, in an aspect of the first thin-film semiconductor device according to the present invention, it is favorable that the interfacial layer has a higher carbon concentration than the protective layer.

According to the present aspect, the above described leakage current can be further reduced.

Furthermore, in an aspect of the first thin-film semiconductor device according to the present invention, it is favorable that a concentration of carbon included in the interfacial layer is greater than or equal to $5 \times 10^{20}$ [atoms/cm$^3$].

According to the present aspect, an effect of reducing the above described leakage current in the interfacial layer can be certainly developed.

Furthermore, in an aspect of the first thin-film semiconductor device according to the present invention, it is favorable that the interfacial layer includes sulfur.

According to the present aspect, the leakage current can be further reduced with sulfur included in the interfacial layer.

Furthermore, in the first thin-film semiconductor device according to the present invention, it is favorable that a concentration of sulfur included in the interfacial layer is greater than or equal to $5 \times 10^{19}$ [atoms/cm$^3$].

According to the present aspect, an effect of reducing the above described leakage current in the interfacial layer can be certainly developed.

Furthermore, in an aspect of the first thin-film semiconductor device according to the present invention, it is favorable that resistivity of the interfacial layer is greater than or equal to $2 \times 10^6$ [Ω·cm].

According to the present aspect, since the insulation of the interfacial layer can be increased, the above described leakage current in the interfacial layer can be further reduced.

Furthermore, in an aspect of the first thin-film semiconductor device according to the present invention, it is favorable that a thickness of the interfacial layer is from 1 nm to 5 nm.

According to the present aspect, when the protective layer is formed by setting carbon as a major component, it is possible to form an interfacial layer having 1 nm to 5 nm in thickness.

Moreover, an aspect of the second thin-film semiconductor device according to the present invention comprises: a gate electrode formed above a substrate; a gate insulating film formed to cover the gate electrode; an oxide semiconductor layer formed above the gate insulating film, the oxide semiconductor layer having a channel region; a protective layer formed above a part of the oxide semiconductor layer, the protective layer containing an organic material; a source electrode and a drain electrode which are electrically connected to the oxide semiconductor layer, wherein a carrier concentration in a portion in which the protective layer is not formed above the oxide semiconductor layer is higher than a carrier concentration in a portion in which the protective layer is formed above the oxide semiconductor layer.

According to the present aspect, it is possible to reduce oxygen deficiency in an oxide semiconductor layer in a channel region, and therefore it is possible to reduce degradation in TFT characteristics. Moreover, since carrier concentration is high and resistance is low in a portion in which the protective layer in the oxide semiconductor layer is not formed, contact resistance can be reduced. Therefore, it is possible to realize a thin-film semiconductor device having excellent ON characteristics.

Furthermore, in an aspect of the second thin-film semiconductor device according to the present invention, the protective layer may be formed only above the channel region.

According to the present aspect, it is possible to cause a difference in carrier concentration in self alignment between the portion in which the protective layer in the oxide semiconductor layer is not formed and the portion in which the protective layer in the oxide semiconductor layer is formed.

Furthermore, in an aspect of the second thin-film semiconductor device according to the present invention, it is favorable that an interfacial layer formed in contact with the protective layer between the oxide semiconductor layer and the protective layer, wherein the protective layer contains silicon, oxygen, and carbon, the interfacial layer includes carbon as a major component, the carbon originating from the protective layer, and the interfacial layer has a higher carbon concentration than the protective layer.

According to the present aspect, since the interfacial layer including carbon as a major component is formed between the oxide semiconductor layer and the protective layer, it is possible to further reduce oxygen deficiency in the oxide semiconductor layer in the channel region.

Moreover, an aspect of the first method for manufacturing a thin-film semiconductor device according to the present invention, the method comprising: preparing a substrate; forming a gate electrode above the substrate; forming a gate insulating film to cover the gate electrode; forming an oxide semiconductor layer above the gate insulating film, the oxide semiconductor layer having a channel region; forming a protective layer above the oxide semiconductor layer by applying an organic material including silicon, oxygen, and carbon; forming, by baking the protective layer, an interfacial layer, in contact with the protective layer, between the oxide semiconductor layer and the protective layer, the interfacial layer including carbon as a major component, the carbon originating from the organic material; and forming a source electrode and a drain electrode which are electrically connected to the oxide semiconductor layer.

According to the present aspect, it is possible to reduce oxygen deficiency in an oxide semiconductor layer in a channel region, and therefore it is possible to provide a thin-film semiconductor device having excellent TFT characteristics. By baking the protective layer comprising an organic material such as silicon, oxygen, and carbon, an interfacial layer including carbon originating from the organic material of the protective layer can be formed above the interface between the oxide semiconductor-layer and the protective layer. With this, since it is possible to reduce excessive carbon diffusion from the protective layer, it is possible to reduce an impurity state in the oxide semiconductor. Therefore, it is possible to provide a thin-film semiconductor device which reduces leakage current when it is OFF.

Furthermore, in the first method for manufacturing a thin-film semiconductor device according to the present invention, it is favorable that a concentration of carbon included in the interfacial layer is greater than or equal to $5\times10^{20}$ [atoms/cm$^3$].

According to the present aspect, an effect of reducing the above described leakage current in the interfacial layer can be certainly developed.

Furthermore, in the first method for manufacturing a thin-film semiconductor device according to the present invention, it is favorable that the interfacial layer includes sulfur.

According to the present aspect, the leakage current can be further reduced with sulfur included in the interfacial layer.

Furthermore, in an aspect of the first method for manufacturing a thin-film semiconductor device according to the present invention, it is favorable that a concentration of sulfur included in the interfacial layer is greater than or equal to $5\times10^{19}$ [atoms/cm$^3$].

According to the present aspect, an effect of reducing the above described leakage current in the interfacial layer can be certainly developed.

Moreover, an aspect of the second method for manufacturing a thin-film semiconductor device according to the present invention includes: preparing a substrate; forming a gate electrode above the substrate; forming a gate insulating film to cover the gate electrode; forming an oxide semiconductor layer above the gate insulating film, the oxide semiconductor layer having a channel region; forming a protective layer above a part of the oxide semiconductor layer by applying an organic material; forming a source electrode and a drain electrode which are electrically connected to the oxide semiconductor layer. forming an insulating film above the source electrode, the drain electrode, and the protective layer; and annealing the oxide semiconductor layer.

According to the present aspect, it is possible to reduce oxygen deficiency in an oxide semiconductor layer in a channel region, and therefore it is possible to provide a thin-film semiconductor device having excellent TFT characteristics.

Furthermore, in an aspect of the second method for manufacturing a thin-film semiconductor device according to the present invention, in the forming of a protective layer, the protective layer may be formed only above the channel region.

According to the present aspect, it is possible to cause a difference in carrier concentration in self alignment between the portion in which the protective layer in the oxide semiconductor layer is not formed and the portion in which the protective layer in the oxide semiconductor layer is formed.

Furthermore, in an aspect of the second method for manufacturing a thin-film semiconductor device according to the present invention, it is favorable that the method further includes forming, by baking the protective layer, an interfacial layer, in contact with the protective layer, between the oxide semiconductor layer and the protective layer, wherein the protective layer contains silicon, oxygen, and carbon, the interfacial layer includes carbon as a major component, the carbon originating from the protective layer, and the interfacial layer has a higher carbon concentration than the protective layer.

According to the present aspect, since the interfacial layer including carbon as a major component is formed between the oxide semiconductor layer and the protective layer, it is possible to further reduce oxygen deficiency in the oxide semiconductor layer in the channel region. Furthermore, since the excessive carbon diffusion in the protective layer can be reduced with the interfacial layer, it is possible to reduce a level caused by at lease one impurity in the oxide semiconductor layer. Therefore, it is possible to provide a thin-film semiconductor device which can reduce leakage current when it is OFF.

An aspect of the third thin-film semiconductor device according to the present invention comprises: a gate electrode formed above a substrate; a gate insulating film formed to cover the substrate in which the gate electrode is formed; a crystalline silicon thin film above the gate insulating film, the crystalline silicon thin film having a channel region; a channel protective layer formed above the crystalline silicon thin film including the channel region, the channel protective layer containing an organic material which includes silicon, oxygen, and carbon; an interfacial layer formed at an interface between the channel region of the crystalline silicon thin film and the channel protective layer, the interfacial layer including carbon as a major component, the carbon originating from the organic material; a source electrode formed above the channel region via the channel protective layer; and a drain electrode arranged opposite to the source electrode, the drain electrode being above the channel region via the channel protective layer.

According to the present aspect, since the interfacial layer including carbon as a major component is formed between the crystalline silicon thin film and the channel protective layer, it is possible to further reduce oxygen deficiency in an upper part of the channel region. With this, carrier mobility in the back channel region of the crystalline silicon thin film can be reduced, and the fixed charge movement from the channel protective layer to the crystalline silicon thin film can be reduced. Therefore, it is possible to reduce leakage current at the time of OFF.

Furthermore, in an aspect of the third thin-film semiconductor device according to the present invention, it is favorable that a concentration of carbon included in the interfacial layer is 50 times or more higher than a concentration of carbon as impurity included in the crystalline silicon thin film. Furthermore, in an aspect of the third thin-film semiconductor device according to the present invention, it is favorable that a concentration of carbon included in the interfacial layer is greater than or equal to $5\times10^{20}$ [atoms/cm$^3$].

According to the present aspect, an effect of reducing the above described carrier mobility in the interfacial layer can be certainly developed.

Furthermore, in an aspect of the third thin-film semiconductor device according to the present invention, it is favorable that the interfacial layer includes sulfur.

According to the present aspect, the above described carrier mobility can be further reduced with sulfur included in the interfacial layer.

Furthermore, in an aspect of the third thin-film semiconductor device according to the present invention, it is favorable that a concentration of sulfur included in the interfacial layer is 100 times or more higher than a concentration of sulfur as impurity included in the crystalline silicon thin film. Moreover, in an aspect of the third thin-film semiconductor device according to the present invention, it is favorable that a concentration of sulfur included in the interfacial layer is greater than or equal to $5\times10^{19}$ [atoms/cm$^3$].

According to the present aspect, an effect of reducing the above described carrier mobility in the interfacial layer can be certainly developed.

Furthermore, in an aspect of the third thin-film semiconductor device according to the present invention, it is favorable that resistivity of the interfacial layer is greater than or equal to $2\times10^6$ [Ω·cm].

According to the present aspect, since the insulation of the interfacial layer can be increased, the above described carrier mobility in the interfacial layer can be further reduced.

Furthermore, in an aspect of the third thin-film semiconductor device according to the present invention, it is favorable that a thickness of the interfacial layer is from 1 nm to 5 nm.

According to the present aspect, when the protective layer is formed by setting carbon as a major component, it is possible to form an interfacial layer having approximately 1 nm to 5 nm in thickness.

Furthermore, in an aspect of the third thin-film semiconductor device according to the present invention, it is favorable that a predetermined channel layer included in the crystalline silicon thin film is a polycrystalline silicon thin film.

According to the present aspect, it is possible to obtain a thin-film semiconductor device having also excellent OFF characteristics.

Furthermore, in an aspect of the third thin-film semiconductor device according to the present invention, it is favorable that a non-crystalline silicon thin film formed between the crystalline silicon thin film and the channel protective layer.

According to the present aspect, it is possible to obtain a thin-film semiconductor device having excellent ON and OFF characteristics.

Moreover, an aspect of the third method for manufacturing a thin-film semiconductor device according to the present invention, the method comprising: a first step of preparing a glass substrate; a second step of forming a gate electrode above the glass substrate; a third step of forming a gate insulating film to cover the glass substrate in which the gate electrode is formed; a fourth step of forming a crystalline silicon thin film above the gate insulating film, the crystalline silicon thin film having a channel region; a fifth step of forming a channel protective layer above the channel region included in the crystalline silicon thin film by applying an organic material including silicon, oxygen, and carbon according to a predetermined coating method; a sixth step of forming, by baking the channel protective layer, an interfacial layer formed at an interface between the crystalline silicon thin film in the channel region and the channel protective layer, the interfacial layer including carbon as a major component, the carbon originating from the organic material; and a seventh step of forming a source electrode and a drain electrode above the channel region via the channel protective layer, the source electrode and the drain electrode being arranged opposite to each other.

According to the present aspect, by baking the channel protective layer made of an organic material including silicon, oxygen, and carbon, an interfacial layer including carbon originating from the organic material of the channel protective layer can be formed at the interface between the crystalline silicone thin film and the channel protective layer. With this, resistance value in the upper part of the channel region can be increased, the carrier mobility in the back channel region of the crystalline silicon thin film can be reduced and the fixed charge movement from the back channel region to the crystalline silicon thin film can be reduced. Therefore, it is possible to reduce leakage current at the time of OFF.

Furthermore, in an aspect of the third method for manufacturing a thin-film semiconductor device according to the present invention, it is favorable that a concentration of carbon included in the interfacial layer is 50 times or more higher than a concentration of carbon as impurity included in the crystalline silicon thin film. Moreover, in an aspect of the third method for manufacturing a thin-film semiconductor device according to the present invention, it is favorable that a concentration of carbon included in the interfacial layer is greater than or equal to $5\times10^{20}$ [atoms/cm$^3$].

According to the present aspect, an effect of reducing the above described carrier mobility in the interfacial layer can be certainly developed.

Furthermore, in an aspect of the third method for manufacturing a thin-film semiconductor device according to the present invention, it is favorable that the interfacial layer includes sulfur.

According to the present aspect, the above described carrier mobility can be further reduced with sulfur included in the interfacial layer.

Furthermore, in an aspect of the third method for manufacturing a thin-film semiconductor device according to the present invention, it is favorable that a concentration of sulfur included in the interfacial layer is 100 times or more higher than a concentration of sulfur as impurity included in the crystalline silicon thin film. Moreover, in an aspect of the third method for manufacturing a thin-film semiconductor device, it is favorable that a concentration of sulfur included in the interfacial layer is greater than or equal to $5\times10^{19}$ [atoms/cm$^3$].

According to the present aspect, an effect of reducing the above described carrier mobility in the interfacial layer can be certainly developed.

Furthermore, in an aspect of the third method for manufacturing a thin-film semiconductor device according to the present invention, it is favorable that the fourth step is performed at a temperature in which hydrogen is released from the crystalline silicon thin film, and steps from the fifth step to the seventh step are performed at a temperature in which the hydrogen is not released from the crystalline thin film. In this case, in an aspect of the third method for manufacturing a thin-film semiconductor device according to the present invention, it is favorable that the temperature in which the hydrogen is released from the crystalline silicon thin film is 400 degrees Celsius or higher, and the temperature at which the hydrogen is not released from the crystalline silicon thin film is 300 degrees Celsius or higher.

According to the present aspect, the firth step to the seventh step, in other words, in the process in the steps after the channel protective layer formation step, are performed at a temperature in which hydrogen is not released from the crystalline silicon thin film. With this, it is possible to prevent hydrogen bonding with a dangling bond of a silicon atom in the crystalline silicon thin film from being released and prevent the dangling bond from being generated again.

Furthermore, in an aspect of the third method for manufacturing a thin-film semiconductor device according to the present invention, an organic material contained in the channel protective layer is removed with hydrogen plasma treatment, and the method further comprises, before the channel protective layer and the interfacial layer are formed in the fifth step and the sixth step, performing a hydrogenation process with hydrogen plasma treatment on the channel region included in the crystalline silicon thin film.

According to the present aspect, hydrogen plasma treatment is performed on crystalline silicon thin film before the channel protective layer is formed. With this, since hydrogen plasma used for removing carbon on the channel protective layer can be reduced, it is possible to prevent hydrogen termination of the dangling bond of the crystalline silicon thin film from being insufficient.

Furthermore, in an aspect of the third method for manufacturing a thin-film semiconductor device according to the present invention, it is favorable that the hydrogen plasma treatment is performed by generating hydrogen plasma with radio frequency power, using hydrogen gas as a material gas, and by irradiating the crystalline silicon thin film with the hydrogen plasma, and a power density of injection power of the radio frequency power is from 0.2 to 0.8 [$W/cm^2$].

According to the present aspect, it is possible to obtain a thin-film semiconductor device having excellent OFF and ON characteristics.

Furthermore, in an aspect of the third method for manufacturing a thin-film semiconductor device according to the present invention, it is favorable that the hydrogen plasma treatment is performed by generating hydrogen plasma with radio frequency power, using hydrogen gas as a material gas, and by irradiating the crystalline silicon thin film with the hydrogen plasma, and a preset electrode temperature when the hydrogen plasma is generated is from 250 to 350 degrees Celsius.

According to the present aspect, it is possible to obtain a thin-film semiconductor device having excellent OFF and ON characteristics.

Moreover, an aspect of the fourth method for manufacturing a thin-film semiconductor device, the method comprising: preparing a substrate; forming a gate electrode above the substrate; forming a gate insulating film to cover the gate electrode; forming a crystalline silicon thin film above the gate insulating film, the crystalline silicon thin film having a channel region; forming a protective layer above the channel region, by applying an organic material including carbon; and forming a source electrode and a drain electrode above the crystalline silicon thin film, wherein an organic material contained in the protective layer is removed with hydrogen plasma treatment, and the method further comprises, between the forming of a crystalline silicon thin film and the forming of a protective layer, performing of a hydrogenation process on the crystalline silicon thin film with hydrogen plasma.

According to the present aspect, hydrogen plasma treatment on crystalline silicon thin film is performed before the channel protective layer is formed. With this, since hydrogen plasma used for removing carbon on the channel protective layer can be reduced, it is possible to prevent hydrogen termination of the dangling bond of the crystalline silicon thin film from being insufficient.

The following will describe a thin-film semiconductor device and a method for manufacturing the thin-film semiconductor device with reference to embodiments. It is to be noted that the embodiments to be described later are mere favorable specific examples in the present embodiment. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. The present invention is specified only by the Claims. Therefore, among the structural elements in the following exemplary embodiments, structural elements not recited in any one of the independent claims are not completely necessary to attain the goal of the present invention, and are described as more desirable structural elements. It is to be noted that each of the drawings is a schematic view and therefore does not technically illustrate. Moreover, in each of the drawings, the same numerals are assigned to the same structural elements.

Embodiment 1

First, a thin-film semiconductor device 10 and a method for manufacturing the thin-film semiconductor device 10 will be described.

(Configuration of Thin-Film Semiconductor Device 10)

A configuration of the thin-film semiconductor device 10 will be described with reference to FIG. 1. FIG. 1 is a cross-sectional view schematically illustrating the thin-film semiconductor device 10 according to Embodiment 1 of the present invention.

As shown in FIG. 1, the thin-film semiconductor device 10 is a bottom-gate thin-film transistor device. The thin-film semiconductor device 10 includes a substrate 1, a gate electrode 2, a gate insulating film 3, a semiconductor layer 4, and a channel protective layer 5 that are sequentially formed above the substrate 1, an interfacial layer 6 that is formed at an interface between the semiconductor layer 4 and the channel protective layer 5, a pair of contact layers 7 and a pair of a source electrode 8s and a drain electrode 8d that are formed above the semiconductor layer 4.

The thin-film semiconductor device 10 according to the present embodiment is a channel-protective thin-film transistor device in which the channel protective layer is formed above the semiconductor layer. Since the channel-protective thin-film transistor device can make the semiconductor layer thin, it is possible to reduce parasitic resistance component as compared to the case with the channel etching thin-film transistor device, with the result that ON characteristics can be increased.

The following will describe the structural elements of the thin-film semiconductor device 10 according to the present embodiment.

The substrate 1 is, for example, a glass substrate composed of a glass material such as quarts glass, alkali-free glass, and high heat resistant glass. An undercoat layer composed of silicon nitride film ($SiN_x$), silicon oxide film ($SiO_y$), or silicon oxynitride film ($SiO_yN_x$) may be formed above the surface of the substrate 1 for inhibiting impurity such as sodium or phosphorus included in the glass substrate from entering the semiconductor layer 4. The undercoat layer plays a role in easing an effect of heat on the substrate 1 in a high temperature heat treatment process such as laser annealing. The undercoat layer has 100 nm to 2000 nm in thickness, for example.

The gate electrode is formed in pattern in a predetermined shape above the substrate 1. The gate electrode 2 can be formed in a single layer structure or multilayer structure of a conductive material and an alloy of the material. For example, the gate electrode is composed of molybdenum (Mo), aluminum (Al), copper (Cu), tungsten (W), titanium (Ti), chromium (Cr), molybdenum tungsten (MoW), and the like. The game electrode can have 20 nm to 500 nm in thickness, for example.

In the present embodiment, the gate insulating film 3 is formed above the gate electrode, and is formed to cover the gate electrode 2 on the whole of the substrate 1. The gate insulating film 3 may be composed of a single layer film of silicon oxide ($S_iO_y$), silicon nitride ($S_iN_x$), silicon oxynitride film ($SiO_yN_x$) aluminum oxide ($AlO_z$), and tantalum oxide ($TaO_w$) or a stacked film of these materials. As the multilayer film, for example, it may be formed in a two-layer structure of a silicon oxide film and a silicon nitride film. Since in the present embodiment, a crystalline silicon thin film is used as the semiconductor layer 4, it is preferable that silicon oxide is used as the gate insulating film 3. The reason for this is that it is preferable to have good interface state between the semiconductor layer 4 and the gate insulating film 3 for maintaining excellent threshold voltage characteristics of the TFT, and silicon dioxide is suitable for this purpose. The thickness of the gate insulating film is in a range from 50 nm to 30 nm, for example.

The semiconductor layer 4 is a semiconductor layer formed on the gate insulating film 3, and has a channel region which is a region in which carrier movement is controlled by voltage at the gate electrode 2. The semiconductor layer 4 is a crystalline silicon thin film having a crystalline organized structure, and is composed of microcrystalline silicon thin film or polycrystalline silicon thin film. The semiconductor film 4 having the polycrystalline silicon thin film can be formed by crystallizing non-crystalline silicon (amorphous silicon). The polycrystalline silicon thin film can be a silicon thin film having a mixed crystal structure of amorphous silicon and crystalline silicon. In this case, in order to obtain excellent ON characteristics, it is preferable that a predetermined channel region of the semiconductor layer 4 is composed of a film having a large proportion of crystalline silicon. The semiconductor layer 4 can have approximately 20 nm to 100 nm in thickness, for example. Moreover, a grain size of crystalline silicon in the polycrystalline silicon thin film is approximately in a range approximately from 5 nm to 1000 nm. The crystalline silicon thin film includes a polycrystalline having average crystalline grain size of 100 nm or more, or a microcrystalline called microcrystal (μc) having average crystalline grain size of 10 nm to 100 nm.

The channel protective layer 5 is a protection film which protects the channel region of the semiconductor layer 4, and is formed above the channel region of the semiconductor layer 4. In the present embodiment, the channel protective layer 5 functions as a channel etching stopper (CES) layer for preventing the channel region of the semiconductor layer 4 from being etched during the etching process for forming the paired contact layers 7. To put it differently, during the etching process for patterning the contact layer 7, the upper part of the organic protective film 6 is etched. Here, the thickness of the channel protective layer 5 (the part not etched by the channel etching) is, for example, from 300 nm to 1000 nm. The lower limit of the thickness of the channel protective layer 5 is determined by controlling the effects of a margin by channel etching and fixed charges in the channel protective layer. Moreover, the upper limit of the channel protective layer is determined by controlling a decrease in reliability of process caused by an increase in the number of steps.

Moreover, the channel protective layer 5 is an organic material layer composed of an organic material mainly including an organic material containing silicon, oxygen, and carbon, and is not an inorganic material including silicon oxide and silicon nitride as major components. It is to be noted that the channel protective layer 5 has insulation, and the paired contact layers 7 are not electrically connected to each other.

In the present embodiment, the channel protective layer 5 is a coated channel protective layer, and is formed by patterning and solidifying the photosensitive coated organic material. The organic material for forming the channel protective layer 5 is, for example, composed of an organic resin material, a surfactant, a solvent, and a photosensitizing agent.

As the organic resin material, photosensitive or non-photosensitive organic resin material composed of one or more of polyimide, acrylic, polyamide, polyimide-amide, resist, and benzocyclobutene may be used. As the surfactant, a surfactant composed of a silicon compound such as siloxane may be used. As the solvent, an organic solvent such as propylene glycol monomethyl ether acetate or 1,4-dioxane may be used. As the photosensitizing agent, a positive photosensitizing agent such as naphthoquinone diazide expressed with the chemical formula below may be used. It is to be noted that the photosensitizing agent includes carbon and sulfur.

[Chemical formula 1]

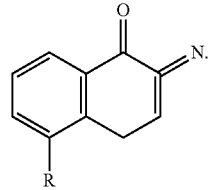

The above-described organic material for forming the channel protective layer 5 may be formed according to a coating method such as spin coating. Alternatively, an organic material may be selectively formed in a predetermined shape according to the liquid drop ejection method or a printing method such as the screen printing or the offset printing which allow formation of the predetermined pattern.

The interfacial layer 6 is an insulating layer which has insulation and is formed between the semiconductor layer 4 that is composed of a crystalline silicon thin film and the channel protective layer 5. It is to be noted that it is favorable that the resistivity of the interfacial layer 6 is greater than or equal to $2 \times 10^6$ [Ω·cm]. The interfacial layer 6 is a layer which is generated when the channel protective layer 5 is formed above the channel region of the semiconductor layer 4, and is generated at an interface between the channel region of the semiconductor layer 4 and the channel protective layer 5.

Moreover, the interfacial layer 6 includes carbon as a major component, and the carbon that is the major component is a carbon originating from the organic material comprising the channel protective layer 5. The carbon that is the major component of the interfacial layer 6 includes carbon included in the organic material for forming the channel protective layer 5. Furthermore, in the present embodiment, the interfacial layer 6 also includes sulfur. A detailed configuration of the interfacial layer 6 will be described later.

The paired contact layers 7 are composed of non-crystalline semiconductor layer including impurity with high concentration. The paired contact layers are formed via the channel protective layer 5 above the channel region of the semiconductor layer 4. The paired contact layers 7 are arranged opposite to each other at a predetermined distance.

In the present embodiment, each of the paired contact layers 7 is formed to straddle the channel protective layer 5 and the semiconductor layer 4, and is formed to cover an upper surface and a side surface of the channel protective layer 5, a side surface of the interfacial layer 6, and an upper surface of the semiconductor layer 4. Moreover, each of the paired contact layers 7 is an n-type semiconductor layer in which amorphous silicon layer is doped with phosphorus (P) as the impurity, and is an n$^+$ layer including a high concentration of impurity of at least $1\times10^{19}$ [atm/cm$^3$]. The thickness of the contact layer 7 is in a range of 5 nm to 100 nm, for example.

The source electrode 8s and the drain electrode 8d which constitute a pair are formed above the channel region of the semiconductor layer 4 via the channel protective layer 5, respectively, and are formed above the paired contact layers 7 in the present embodiment. The paired source electrode 8s and drain electrode 8d are arranged opposite to each other at a predetermined distance. The source electrode 8s and the drain electrode 8d are electrically connected to the semiconductor layer 4. In other words, when a voltage is applied to the gate electrode 2, a carrier moves from the source electrode 8s and the drain electrode 8d to the semiconductor layer 4.

In the present embodiment, the source electrode 8s and the drain electrode 8d are made of single-layer structure or a multi-layer structure of a conductive material, an alloy including the conductive material, or the like, and are made of, for example, aluminum (Al), molybdenum (Mo), tungsten (W), copper (Cu), titanium (Ti), chromium (Cr), or others. In this embodiment, the source electrode 8s and the drain electrode 8d are formed as a tri-layer structure of MoW/Al/MoW. Each of the source electrode and the drain electrode can have 100 nm to 500 nm in thickness, for example.

Figure 2A:
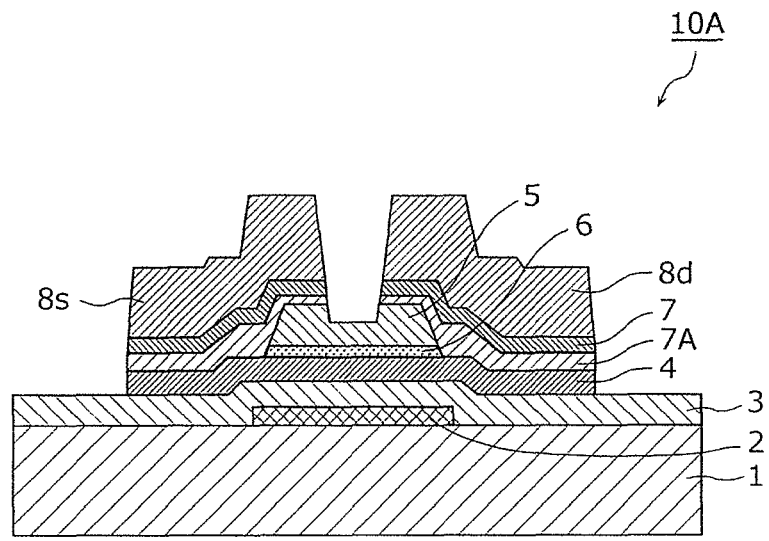
FIG. 2A is a cross-sectional view schematically illustrating a thin-film semiconductor device according to Modification 1 of Embodiment 1 of the present invention.

The thin-film semiconductor device 10 according to the present embodiment is configured as described above. However, it is possible to be configured as described in FIG. 2A. FIG. 2A is a cross-sectional view schematically illustrating a configuration of a thin-film semiconductor device 10A according to Modification 1 of Embodiment 1 of the present invention. Moreover, in FIG. 2A, the same numerals are assigned to the same structural elements as those shown in FIG. 1.

As shown in FIG. 2A, the difference of the thin-film semiconductor device 10A according to the present modification from the thin-film semiconductor device 10 in FIG. 1 is that the paired non-crystalline silicon layers 7A are formed between the pair of contact layers 7 and the source electrode 8s and the drain electrode 8d.

The paired non-crystalline silicon layers 7A are formed via the channel protective layer 5 above the channel region of the semiconductor layer 4. The paired non-crystalline silicon layers 7A are arranged opposite to each other at a predetermined distance.

The non-crystalline silicon layer 7A is a non-crystalline silicon (amorphous silicon) layer and is an i layer on which intentional impurity doping is not performed. Therefore, the non-crystalline silicon layer 7A has higher electrical resistance than the contact layer 7 in which impurity is doped. It is to be noted that although impurity doping is not performed on the non-crystalline silicon layer 7A, natural impurity exists. The non-crystalline silicon layer 7A has an impurity concentration of up to $1\times10^{17}$ [atm/cm$^3$].

An introduction of the non-crystalline silicon layer 7A has an object to reduce OFF current. A material having band gap energy greater than that of the semiconductor layer 4 is introduced. It is favorable for the non-crystalline silicon layer 7A to use a material having band gap energy of 1.60 to 1.90 eV. Moreover, as layer in which an impurity having a lower impurity concentration than that of the contact layer 7 is doped may be introduced between the non-crystalline silicon layer 7A and the contact layer 7. Alternatively, a profile may be formed in which the concentration of the impurity in the contact layer 7 steadily decreases. With this, by moderating a change in the profile of the impurity concentration between the non-crystalline layer 7A and the contact layer 7, electric field in the drain region is eased and OFF current can be further reduced.

In the present embodiment, the paired non-crystalline contact layers 7A are formed to straddle the channel protective layer 5 and the semiconductor layer 4, and are formed to cover an upper portion and a side surface of the channel protective layer 5, a side surface of the interfacial layer 6, and an upper surface of the semiconductor layer 4. The paired non-crystalline contact layers 7A are formed above the paired the contact layers 7.

Figure 2B:
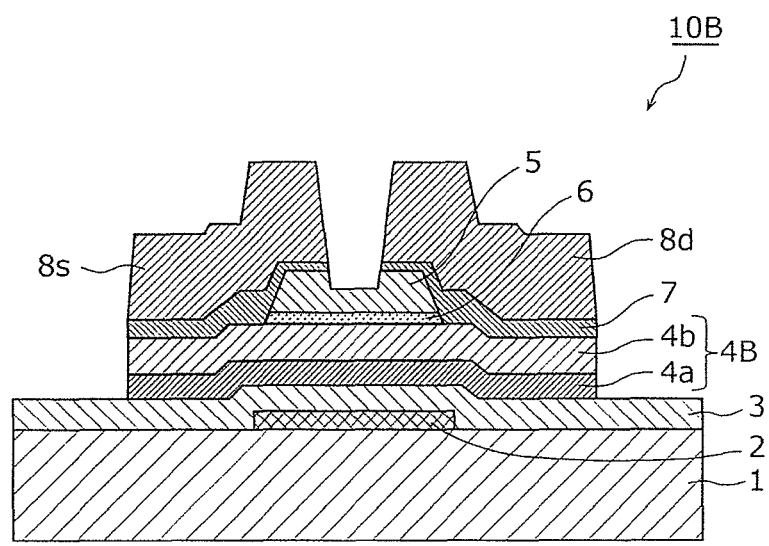
FIG. 2B is a cross-sectional view schematically illustrating a thin-film semiconductor device according to Modification 2 of Embodiment 1 of the present invention.

The thin-film semiconductor device 10 according to the present embodiment can be configured as shown in FIG. 2B. FIG. 2B is a cross-sectional view schematically illustrating a thin-film semiconductor device 10B according to Modification 2 of Embodiment 1 of the present invention. Moreover, in FIG. 2B, the same numerals are assigned to the same structural elements as those shown in FIG. 1.

As shown in FIG. 2B, in the thin-film semiconductor device 10B according to the present modification, a semiconductor layer 4B to be the channel layer has a multilayer structure of a crystalline silicon thin film 4a (first channel layer) and a non-crystalline silicon thin film 4b (second channel layer). In other words, the difference of the thin-film semiconductor device 10B according to the present modification from the thin-film semiconductor device 10 in FIG. 1 is that a non-crystalline silicon thin film (amorphous silicon) is formed on the semiconductor layer 4 made of the crystalline silicon thin film.

Moreover, in the present modification, the non-crystalline silicon thin film 4b is formed between a crystalline silicon thin film 4a and the channel protective layer 5, and the interfacial layer 6 is formed at an interface between the non-crystalline silicon thin film 4b and the channel protective layer 5.

According to the present modification, it is possible to obtain a thin-film semiconductor device having excellent ON and OFF characteristics.

(Method of Manufacturing Thin-Film Semiconductor Device 10)

Figure 3A:
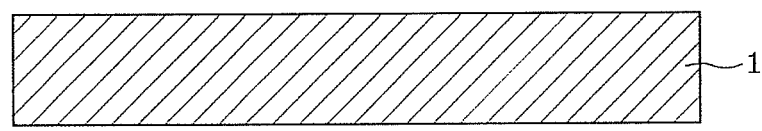
FIG. 3A is a cross-sectional view schematically illustrating a base preparation step in a method for manufacturing the thin-film semiconductor device according to Embodiment 1 of the present invention.
Figure 3B:
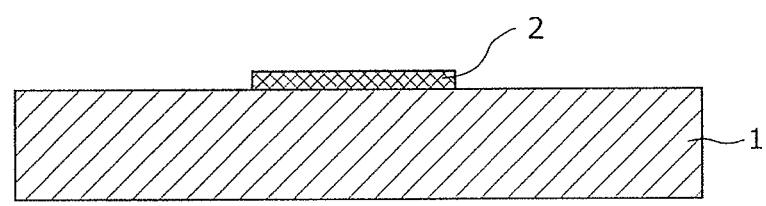
FIG. 3B is a cross-sectional view schematically illustrating a gate electrode formation step in a method for manufacturing the thin-film semiconductor device according to Embodiment 1 of the present invention.
Figure 3C:
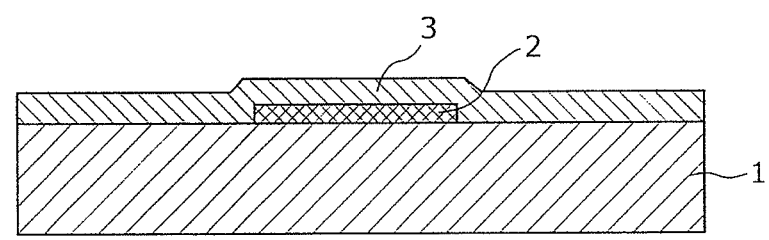
FIG. 3C is a cross-sectional view schematically illustrating a gate insulating formation step in a method for manufacturing the thin-film semiconductor device according to Embodiment 1 of the present invention.
Figure 3D:
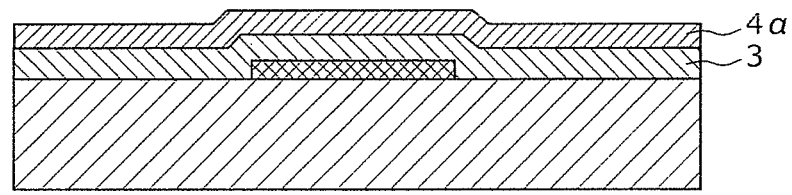
FIG. 3D is a cross-sectional view schematically illustrating a non-crystalline silicon thin film formation step in a method for manufacturing the thin-film semiconductor device according to Embodiment 1 of the present invention.
Figure 3E:
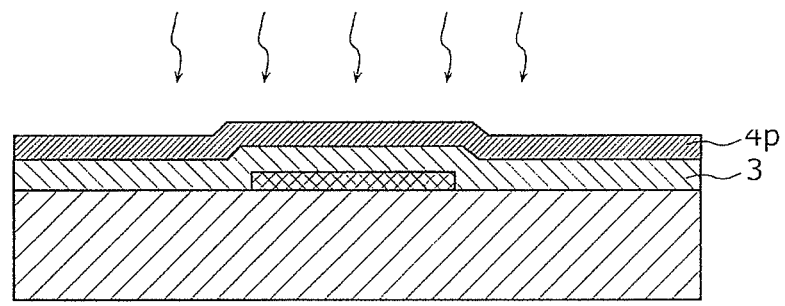
FIG. 3E is a cross-sectional view schematically illustrating a non-crystalline silicon thin film crystallization step in a method for manufacturing the thin-film semiconductor device according to Embodiment 1 of the present invention.
Figure 3F:
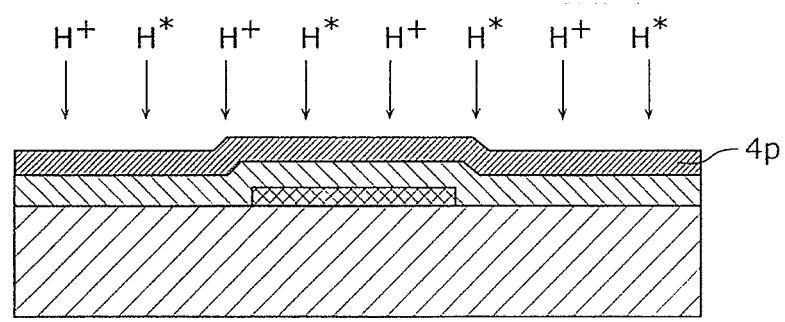
FIG. 3F is a cross-sectional view schematically illustrating a hydrogen plasma treatment step in a method for manufacturing the thin-film semiconductor device according to Embodiment 1 of the present invention.
Figure 3G:
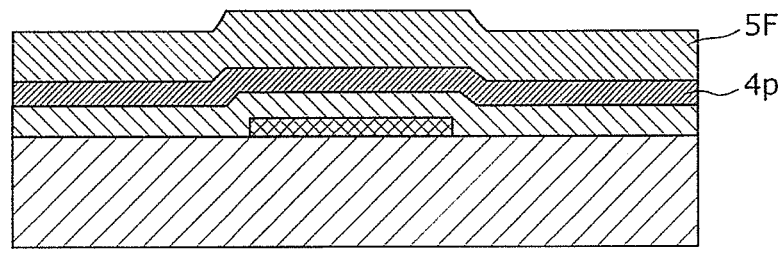
FIG. 3G is a cross-sectional view schematically illustrating a channel protective layer film formation step in a method for manufacturing the thin-film semiconductor device according to Embodiment 1 of the present invention.
Figure 3H:
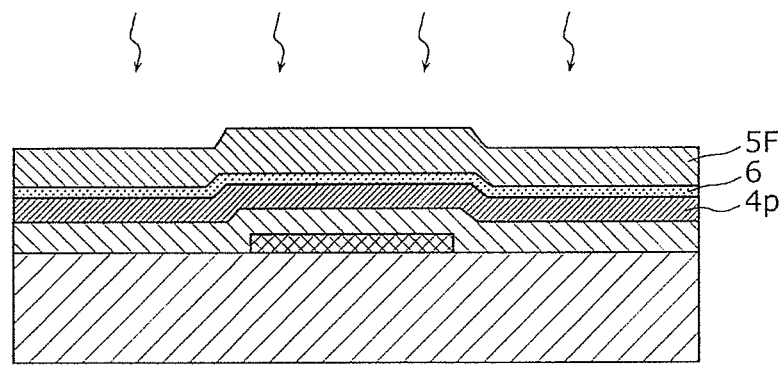
FIG. 3H is a cross-sectional view schematically illustrating a prebake step of a channel protective layer film in a method for manufacturing the thin-film semiconductor device according to Embodiment 1 of the present invention.
Figure 3I:
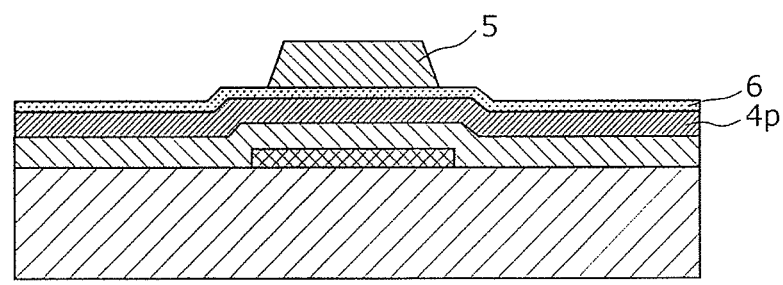
FIG. 3I is a cross-sectional view schematically illustrating a channel protective layer patterning step in a method for manufacturing the thin-film semiconductor device according to Embodiment 1 of the present invention.
Figure 3J:
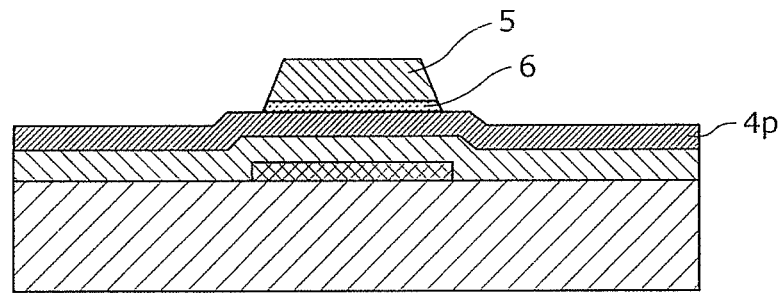
FIG. 3J is a cross-sectional view schematically illustrating an interfacial layer removal step in a method for manufacturing the thin-film semiconductor device according to Embodiment 1 of the present invention.
Figure 3K:
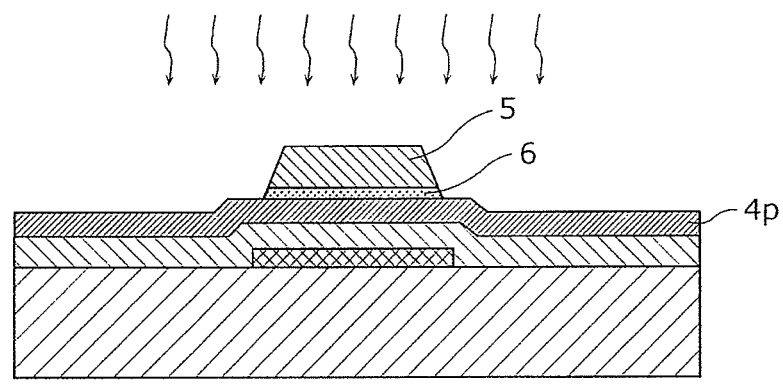
FIG. 3K is a cross-sectional view schematically illustrating a postbake step of a channel protective layer film in a method for manufacturing the thin-film semiconductor device according to Embodiment 1 of the present invention.
Figure 3L:
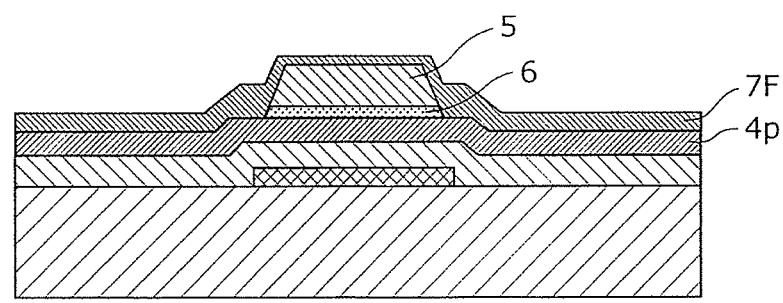
FIG. 3L is a cross-sectional view schematically illustrating a contact layer film formation step in a method for manufacturing the thin-film semiconductor device according to Embodiment 1 of the present invention.
Figure 3M:
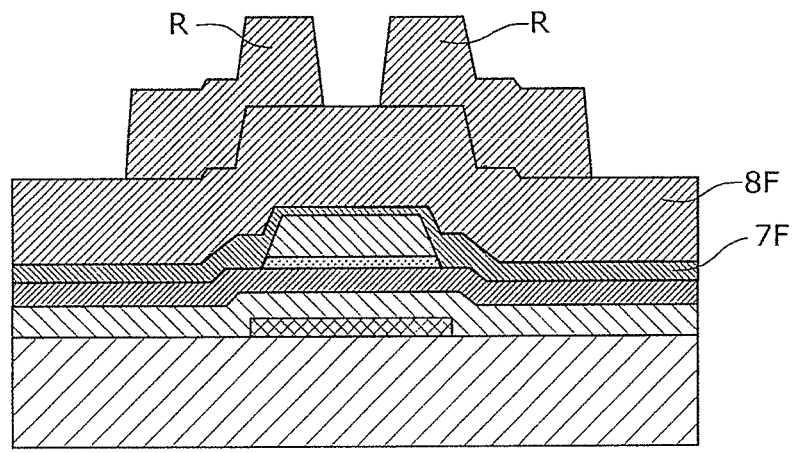
FIG. 3M is a cross-sectional view schematically illustrating a source-drain metal film formation step in a method for manufacturing the thin-film semiconductor device according to Embodiment 1 of the present invention.
Figure 3N:
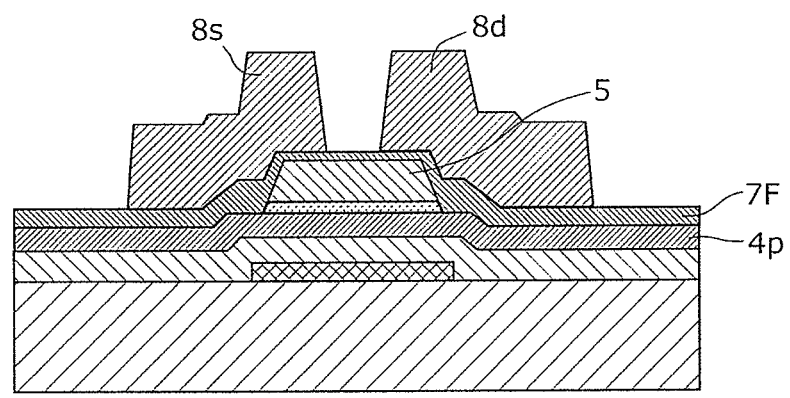
FIG. 3N is a cross-sectional view schematically illustrating a patterning step of a source electrode and a drain electrode in a method for manufacturing the thin-film semiconductor device according to Embodiment 1 of the present invention.
Figure 3O:
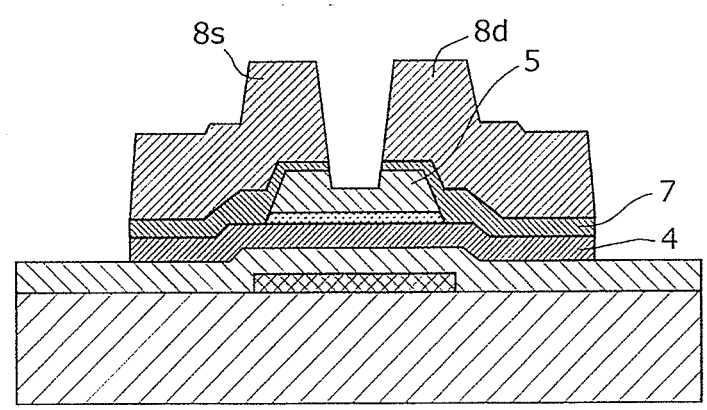
FIG. 3O is a cross-sectional view schematically illustrating a patterning step of a contact layer and a semiconductor layer in a method for manufacturing the thin-film semiconductor device according to Embodiment 1 of the present invention.

The following will describe a method for manufacturing the thin-film semiconductor device 10 with reference to FIGS. 3A to 3O. FIGS. 3A to 3O each are a cross-sectional view schematically illustrating the steps in the method for manufacturing the thin-film semiconductor device 10 according to Embodiment 1 of the present invention.

First, as shown in FIG. 3A, a glass substrate as the substrate 1 is prepared. It is to be noted that before the gate electrode 2 is formed, an undercoat layer which is made of the silicon nitride film, the silicon oxide film, and the silicon oxynitride film may be formed above the substrate 1 with the plasma Chemical Vapor Deposition (CVD) and the like.

Next, as shown in FIG. 3B, the gate electrode 2 in a predetermined shape is formed above the substrate 1. For example, the gate electrode 2 with a predetermined shape can be formed with sputtering by forming a gate metal film made of molybdenum tungsten (MoW) above the substrate 1 and by performing patterning on the gate metal film according a photolithography method and a wet etching method. The wet etching of MoW may be performed using a medical solution obtained through mixing phosphoric acid ($HPO_4$), nitric acid ($HNO_3$), acetic acid ($CH_3COOH$), and water according to a predetermined composition.

Next, as shown in FIG. 3C, the gate insulating film 3 is formed to cover the substrate 1 above which the gate electrode 2 is formed. For example, the gate insulating film 3 made of silicon oxide is formed to cover the gate electrode 2 with plasma CVD and the like. Silicon oxide, for example, can be formed through an introduction of silane gas ($SiH_4$) and nitrous oxide gas ($N_2O$) at a predetermined concentration ratio.

Next, as shown in FIG. 3D, on the gate insulating film 3, a non-crystalline silicon thin film 4a made of amorphous silicon (non-crystalline silicon) is formed. The non-crystalline silicon thin film 4a can be formed with plasma CVD and the like. The non-crystalline silicon thin film 4a, for example, can be formed through an introduction of silane gas ($SiH_4$) and hydrogen gas ($H_2$) at a predetermined concentration ratio.

Next, after the dehydrogenation annealing at 400° C. or more in which hydrogen is released from the non-crystalline silicon thin film 4a is performed, annealing is performed on the non-crystalline silicon thin film 4a at a temperature in a range from 500 to 900° C., and crystallization is performed on the non-crystalline silicon thin film 4a. With this, as shown in FIG. 3E, above the gate insulating film 3, a crystalline silicon thin film 4p having a channel region can be formed. It is to be noted that in the present embodiment, crystallization is performed on the non-crystalline silicon thin film 4a with laser annealing using excimer laser. As a crystallization method, it is possible to use a laser annealing method using pulse laser having a wavelength of 370 nm to 900 nm, a laser annealing method using continuous oscillation laser with a wavelength of 370 nm to 900 nm, or an annealing method using rapid thermal processing (RTP). Alternatively, the crystalline silicon thin film may be formed by using a method—such as direct growth with CVD instead of crystallizing the non-crystalline silicon thin film.

Next, as shown in FIG. 3F, by performing hydrogen plasma treatment on the crystalline silicon thin film 4p, hydrogenation is performed on a silicon atom of the crystalline silicon thin film 4p. The hydrogen plasma treatment is performed by generating hydrogen plasma with radio frequency (RF) power, based on gas including hydrogen gas such as $H_2$ and $H_2$/argon (Ar), and by irradiating the crystalline silicon thin film 4p with the hydrogen plasma.

With the hydrogen plasma treatment, the dangling bond (defect) of the silicon atom is hydrogen terminated. In other words, the dangling bonds of the silicon atoms bond with hydrogen. With this, the crystal defect density of the crystalline silicon thin film 4p is reduced, and crystallinity is increased.

It is to be noted that the hydrogen plasma treatment is to generate hydrogen plasma including hydrogen ion ($H^+$) and hydrogen radical ($H^*$) in a plasma atmosphere. By the entry of the generated hydrogen ion and hydrogen radical into the crystalline silicon thin film, the dangling bonds of silicon atoms constituting the crystalline silicon thin film 4p are hydrogen terminated.

Next, as shown in FIG. 3G, according to a predetermined coating method, a predetermined organic material is coated for forming the channel protective layer 5, and a channel protective layer film 5F is formed above the channel region included in the crystalline silicon thin film 4p. For example, by performing coating, spin coating, and slit coating of a predetermined organic material on the crystalline silicon thin film 4p, the channel protective layer film 5F is formed above the whole surface of the crystalline silicon thin film 4p. The thickness of the channel protective layer film 5F can be controlled with the viscosity of the organic material and coating conditions (the number of rotations, the speed of blade, and the like).

It is to be noted that the above described photosensitive coated organic material including silicon, oxygen, and carbon can be used as a predetermined organic material of the film for the channel protective layer film 5F.

Next, as shown in FIG. 3H, the channel protective layer film 5F is prebaked, and is calcined. For example, the film is prebaked for 60 seconds at the temperature of approximately 110° C. With this, the solvent included in the channel protective layer film 5F evaporates.

At this time, by the baking of the channel protective layer film 5F, as shown in FIG. 3H, the interfacial layer 6 is generated at an interface between the crystalline silicon thin film 4p in the channel region of the semiconductor layer 4 and the channel protective layer film 5F. The generated interfacial layer 6 includes carbon as a major component, and the carbon that is the major component is carbon originating from the organic material of the channel protective layer film 5F formed above the semiconductor layer 4.

Next, as shown in FIG. 3I, since a photosensitive organic material is used as the channel protective layer film 5F, exposure and development are performed on the channel protective layer film 5F using a photomask which regulates a portion in which the channel protective layer 5 is formed, and the channel protective layer 5 in a predetermined shape can be formed above a portion which is the channel region of the crystalline silicon thin film 4p. It is to be noted that a water solution of tetra methyl ammonium hydroxide (TMAH) with a concentration of 2.38% can be used as a developing solution.

It is to be noted that when the photosensitive organic material is not used, it is possible to form the channel protective layer 5 in a predetermined shape on the crystalline silicon thin film 4p by performing patterning on the channel protective layer film 5F according to the photolithography method and the wet etching method.

It is to be noted that as shown in FIG. 3I, the interfacial layer 6 is not removed by the development process when the pattern formation is performed for the channel protective layer 5, and the interfacial layer 6 in the region not covered with the channel protective layer 5 is exposed.

Next, as shown in FIG. 3J, the exposing interfacial layer 6 is removed. For example, the exposing portion of the interfacial layer 6 can be removed according to dry etching using $CF_4$ and $O_2$ or wet etching using dilute hydrofluoric acid (DHF). With this, the crystalline silicon thin film 4p which is not covered with the channel protective layer 5 is exposed.

Next, as shown in FIG. 3K, the patterned channel protective layer 5 is post-based, and the channel protective layer 5 is fully burned. For example, heating is performed at a temperature from 280 to 300° C. for about an hour. With this, part of the organic component in the channel protective layer 5 evaporates and dissolves, and film quality is increased.

Next, as shown in FIG. 3L, a contact layer film 7F to be the contact layer 7 is formed above the crystalline silicon thin film 4p to cover the channel protective layer 5. For example, the contact layer film 7F made of an amorphous silicon film doped with an impurity of pentavalent element such as phosphorous (P) is formed through the plasma CVD.

Next, as shown in FIG. 3M, a source-drain metal film 8F to be the source electrode 8s and the drain electrode 8d is formed above the contact layer film 7F. For example, the source-drain metal film 8F with a tri-layer structure of MoW/Al/MoW is formed by sputtering.

As shown in FIG. 3M, for forming the source electrode 8s and the drain electrode 8d having predetermined shapes, a resist R patterned in a predetermined shape is formed by coating a resist material above the source-drain metal film 8F and performing exposure and development on the source-drain metal film 8F.

Next, by performing wet etching using a resist 9 as mask and patterning the source-drain metal film 8F, as shown in FIG. 3N, the source electrode 8s and the drain electrode 8d having the predetermined shapes are formed. It should be noted that the contact layer film 7F serves as an etching stopper. Subsequently, the resist R is removed. With this, the source electrode 8s and the drain electrode 8d can be formed above the channel region of the crystalline silicon thin film 4p.

Next, as shown in FIG. 3O, the contact layer film 7F and the silicon thin film 4p are patterned in an insular shape by performing dry etching using the source electrode 8s and the drain electrode 8d as masks. With this, the paired contact layers 7 having predetermined shapes and the semiconductor layer 4 can be formed. It is to be noted that chlorine gas may be used for the dry etching. The insular patterning on the contact layer film 7F and the crystalline silicon thin film 4p may be performed with the dry etching using a resist mask after wet etching is performed on the source electrode 8s and the drain electrode 8d.

In this way, the thin-film semiconductor device 10 according to Embodiment 1 of the present invention can be manufactured. It is to be noted that in the present embodiment, the portion of the interfacial layer 6 which is not covered with the channel protective layer 5 is removed. However, the portion of the interfacial layer 6 does not have to be removed. It is to be noted that ON characteristics can be further increased when the interfacial layer 6 is removed, compared with when the interfacial layer 6 is not removed. Moreover, although not illustrated in the drawings, a passivation film made of SiN and the like may be formed to cover the whole of the thin-film semiconductor device 10.

(Configuration of Interface Layer of Thin-Film Semiconductor Device 10)

Figure 4A:
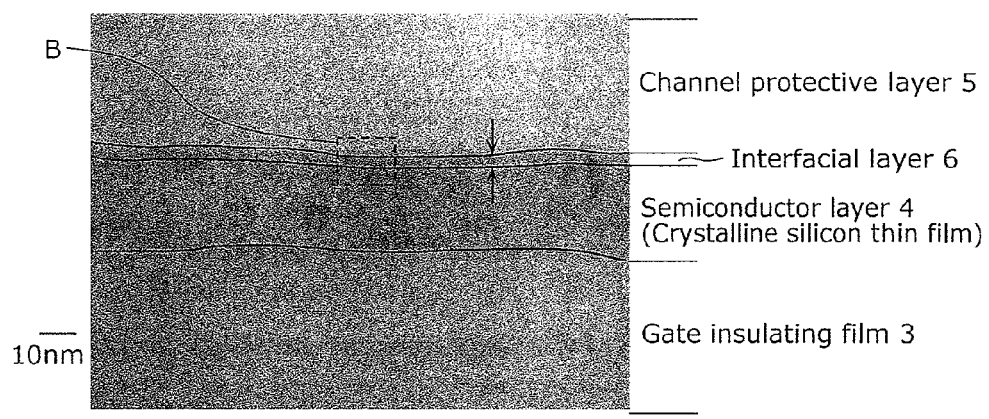
FIG. 4A is a cross-sectional TEM image of a region A circled by a broken line in FIG. 1 in a thin-film semiconductor device manufactured according to the method for manufacturing the thin-film semiconductor device according to Embodiment 1 of the present invention.
Figure 4B:
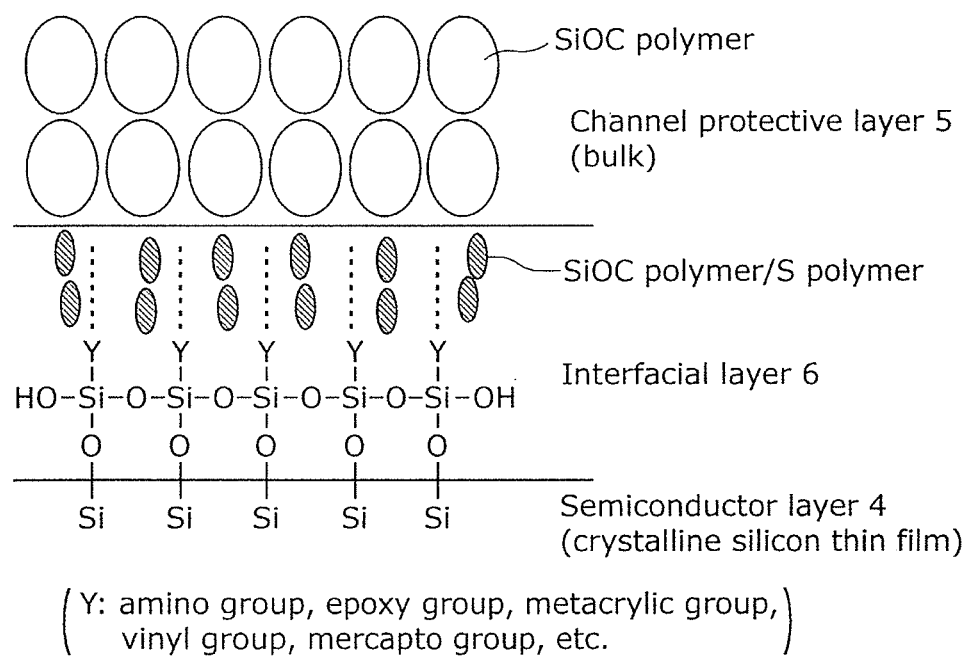
FIG. 4B is a schematic view for explaining a cross-sectional structure of a region B circled with a broken line in FIG. 4A.

A configuration of the interfacial layer 6 in the thin-film semiconductor device 10 as manufactured according to the above method will be described with reference to FIGS. 4A and 4B. FIG. 4A is a cross-sectional TEM image of the thin-film semiconductor device 10 (region A circled with a broken line in FIG. 1) manufactured according to the above manufacturing method. FIG. 4B is a schematic view for explaining a cross-sectional structure of a region B circled with a broken line in FIG. 4A.

As shown in FIG. 4A, when the thin-film semiconductor device 10 is manufactured as described above, it is found that the interfacial layer 6 having a thin film is formed at the interface between the semiconductor layer 4 made of the crystalline silicon thin film and the channel protective layer 5. Moreover, from FIG. 4A, it is found that the interfacial layer 6 is formed with a thickness of approximately 2 nm.

The interfacial layer 6, as described above, is a layer generated when heating and solidification are performed on the channel protective layer 5. In the present embodiment, as shown in FIG. 4B, the semiconductor layer 4 side of the interfacial layer 6, the silicon compound of the surfactant included in the material of the channel protective layer film 5F is believed to bond with the silicon atoms of the semiconductor layer 4.

Specifically, as shown in FIG. 4B, in the interface between the interfacial layer 6 and the semiconductor layer 4, Y—Si—(O)$_3$ of the surfactant and Si of the crystalline silicon thin film are bonded together, and Si—O—Si bond exists. It should be noted that Y in Y—Si—(O)$_3$ is a functional group which has a reaction bonding with an organic material. For example, Y includes an amino group, an epoxy group, a metacrylic group, a vinyl group, or a mercapto group.

Moreover, on the channel protective layer 5 side of the interfacial layer 6, there are a SiOC polymer (thin film formed using at least Si, O, and C as major elements) and an S polymer (thin film containing Si, O, C, and S as constituent elements). The SiOC polymer is believed to be obtained by polymerization of the silicon compound of the surfactant included in the material of the channel protective layer film 5F and carbon included in the photosensitive organic resin material. Moreover, the S polymer is believed to be a thin film obtained through polymerization of a photosensitive agent, a surfactant, and a photosensitive agent that are included in the organic material of the channel protective layer film 5F.

As described above, the interfacial layer 6 is believed to have a configuration in which the Si—O—Si bond and the polymer are multiply formed in matrix. Moreover, the channel protective layer 5 made of bulk SiOC polymers exists above the interfacial layer 6.

It is to be noted that it is obvious from FIG. 4A that the interfacial layer 6 is made of a material different from that of semiconductor layer 4 and that of the channel protective layer 5. In other words, as shown in the TEM image in FIG. 4A, a layer having a different contrast is found between the semiconductor layer 4 and the channel protective layer 5. The difference in contract in the TEM image indicates a difference in density of the material, and therefore indicates that there are different layers. Therefore, the interfacial layer 6 exists between the semiconductor layer 4 and the channel protective layer 5, as a layer different from these layers.

Figure 5A:
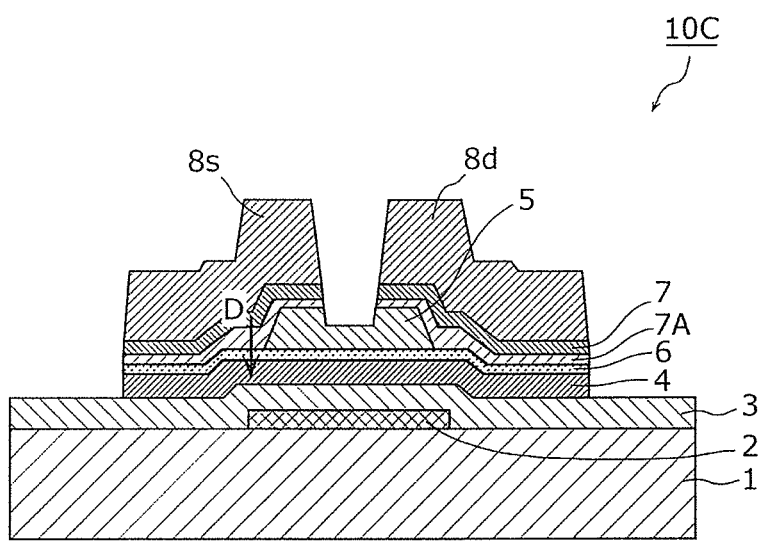
FIG. 5A is a cross-sectional view of a thin-film semiconductor device according to Modification 3 of Embodiment 1 of the present invention.
Figure 5B:
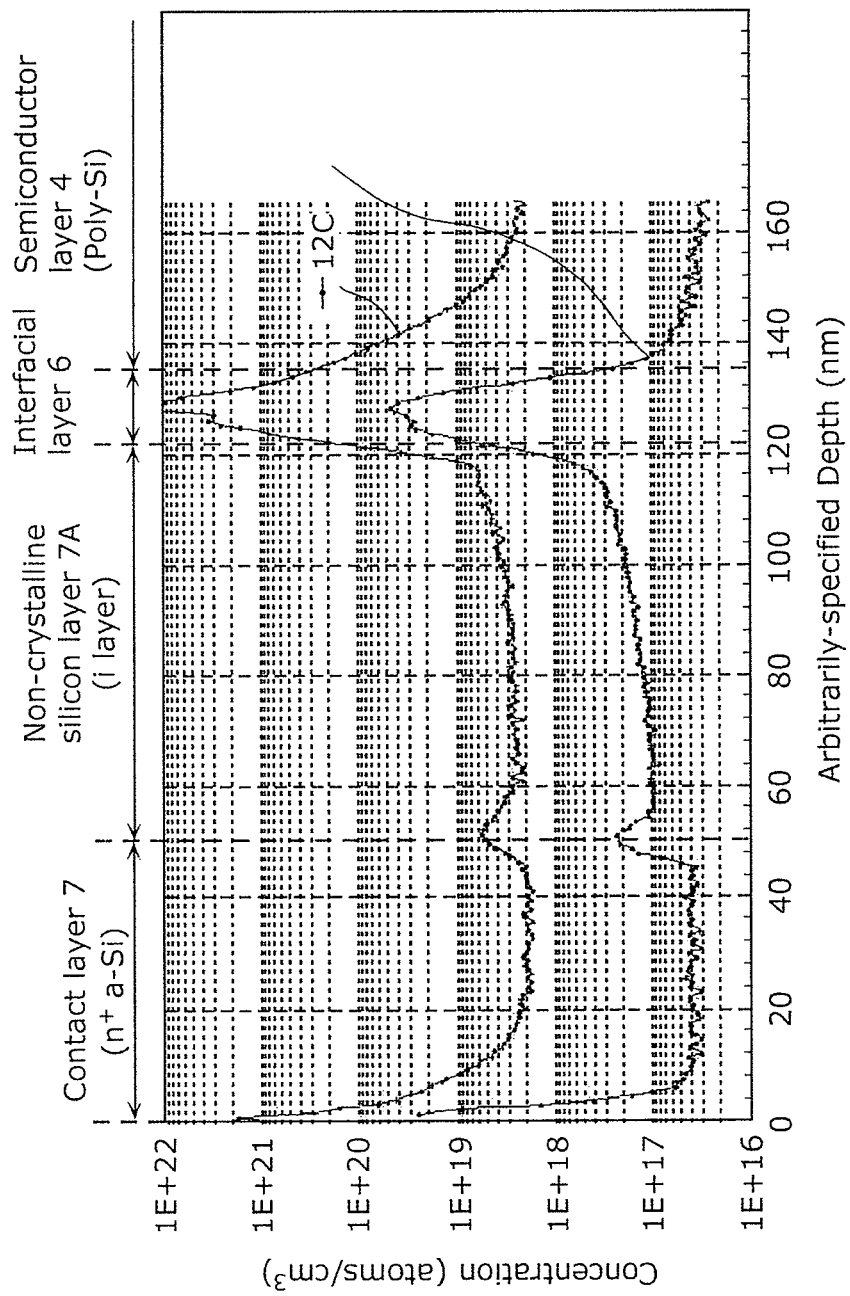
FIG. 5B is a diagram showing a distribution in concentration of carbon and sulfur included in a film included in the thin-film semiconductor device shown in FIG. 5A.

Next, a concentration distribution of carbon (C) and sulfur (S) in the thin-film semiconductor device according to the present embodiment will be described with reference to FIGS. 5A and 5B. FIG. 5A is a cross-sectional view schematically illustrating a configuration of a thin-film semiconductor device 10C according to Modification 3 of Embodiment 1 of the present invention which is manufactured when the above described carbon and sulfur concentrations are measured. Moreover, FIG. 5B is a graph showing the concentration distributions of carbon and sulfur included in the film comprising the thin-film semiconductor device 10C shown in FIG. 5A. The element concentration in a thickness (depth) direction indicated by an arrow D in FIG. 5A is measured according to secondary ion mass spectroscopy (SIMS) and then is plotted.

The thin-film semiconductor device 10C shown in FIG. 5A has a configuration in the case where the portion of the interfacial layer 6 which is not covered with the channel protective layer 5 is not removed in the thin-film semiconductor device 10A having the non-crystalline silicon layer 7A shown in FIG. 2A.

In the thin-film semiconductor device 10C shown in FIG. 5A, when the concentrations of carbon and sulfur are measured along a depth direction of the arrow D, in other words, when the concentrations of carbon and sulfur in the contact layer 7, the non-crystalline silicon layer 7A, the interfacial layer 6, and the semiconductor layer 4 are sequentially measured, the measurement results are as shown in FIG. 5B. It is to be noted that curved lines indicated by 12C and 32S in FIG. 5B each show the concentration distributions of carbon and sulfur.

As shown in FIG. 5B, the interfacial layer 6 has higher carbon concentration and higher sulfur concentration than other layers. It is found that the carbon concentration included in the interfacial layer 6 is greater than or equal to $5 \times 10^{20}$ [atom/cm$^3$], and the sulfur concentration included in the interfacial layer 6 is greater than or equal to $5 \times 10^{19}$ [atm/cm$^3$].

Furthermore, the carbon concentration in the interfacial layer 6 is 50 times or more higher than the carbon concentration as impurity included in the semiconductor layer 4. Furthermore, it is clear that the sulfur concentration included in the interfacial layer 6 is 100 times or more higher than the sulfur concentration as impurity included in the semiconductor layer 4.

It is to be noted that the measurement results in FIG. 5B are for the thin-film semiconductor device 10C shown in FIG. 5A. The same measurement results as those in FIG. 5 can be obtained from the thin-film semiconductor devices 10, 10A, and 10B shown in FIG. 1, FIG. 2A, and FIG. 2B, respectively.

(Operational Effect of Thin-Film Semiconductor Device 10)

Figure 6A:
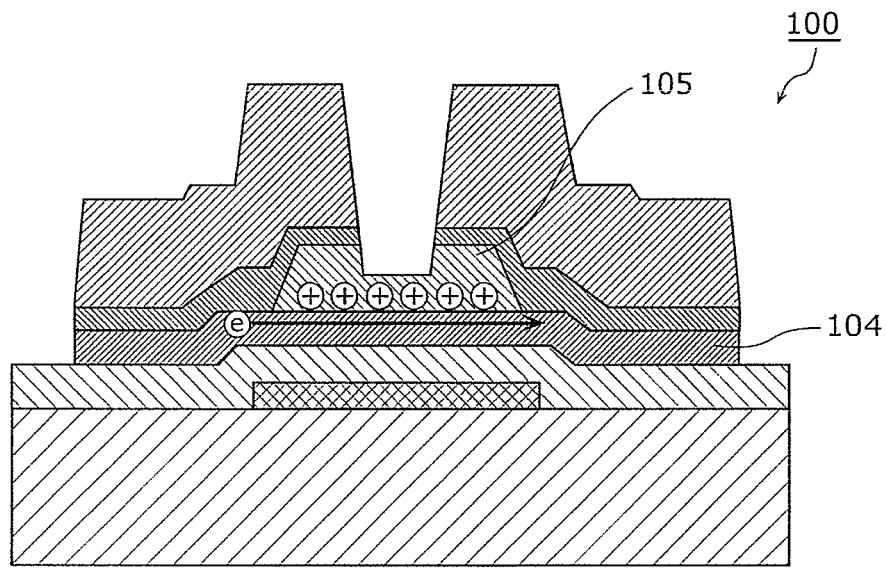
FIG. 6A is a diagram for explaining an operation of a thin-film semiconductor device according to a conventional example.
Figure 6B:
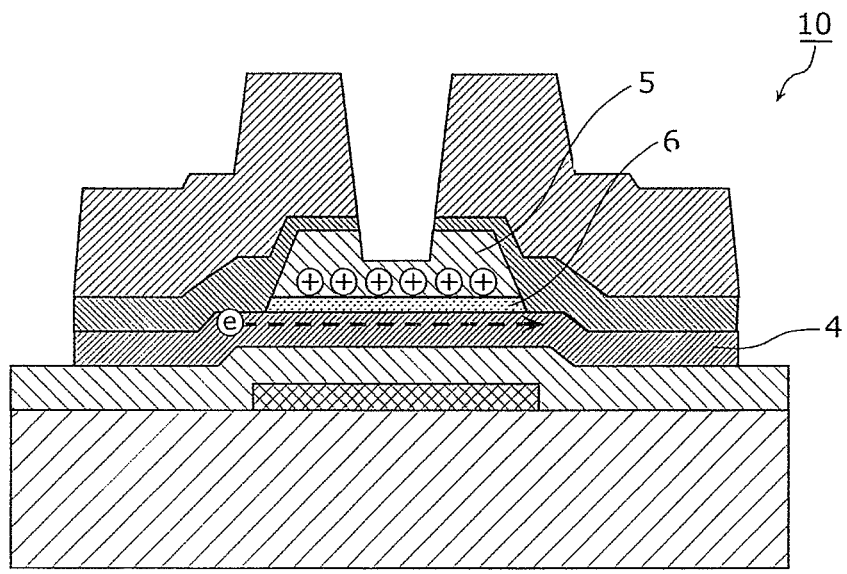
FIG. 6B is a diagram for explaining an operation of a thin-film semiconductor device according to Embodiment 1 of the present invention.

Next, an operational effect of the thin-film semiconductor device 10 according to the present embodiment will be described with reference to FIGS. 6A and 6B. FIG. 6A is a diagram for explaining an operation of the thin-film semiconductor device 100 according to a conventional example. FIG. 6B is a diagram for explaining an operation of the thin-film semiconductor device 10 according to Embodiment 1 of the present invention shown in FIG. 1.

As shown in FIG. 6A, in the thin-film semiconductor device 100 according to the conventional example, a channel protective layer 105 made of an inorganic material of silicon oxide and the like is formed above the channel region of a semiconductor layer 104. As shown in the thin-film semiconductor device 100 according to the conventional example in FIG. 6A, when the channel protective layer 105 is formed with the inorganic material of silicon oxide and the like, positive fixed charges are generated in the channel protective layer 105. Therefore, a low voltage (Vf) is applied by the fixed charges to the semiconductor layer 104 below the channel protective layer 105 (interface between the channel protective layer 105 and the semiconductor layer 104). In this case, when the voltage (Vf) due to the fixed charges is higher than or equal to a threshold voltage (Vbc) in the back channel of the semiconductor layer 104, a parasitic transistor operates to cause leakage current to flow via the back channel in the semiconductor layer 104 when the thin-film semiconductor device 100 is OFF. Especially, when the crystalline silicon thin film is used as the semiconductor layer 104, the carrier mobility is increased in the interface between the channel protective layer 105 and the semiconductor layer 104. Therefore, the leakage current is increased at the time of OFF. In this way, there is a problem that in the conventional thin-film semiconductor device using an inorganic material as the channel protective layer, the OFF characteristics are decreased due to higher OFF current.

Therefore, as shown in the thin-film semiconductor device 10 in FIG. 6B, the investors and others decided to form the interfacial layer 6 which includes carbon as a major component between the semiconductor layer 4 and the channel protective layer 5, using an organic material as the channel protective layer 5.

The interfacial layer 6 formed in this way includes carbon as a major component, and contains more carbon than the semiconductor layer 4 (crystalline silicon thin film). Since the interfacial layer 6 including carbon as a major component exists at the interface between the semiconductor layer 4 (crystalline silicon thin film) and the channel protective layer 5, the interfacial layer 6 serves as a barrier to block the movement of the carrier. In other words, the resistance value in the upper portion of the channel region in the semiconductor layer 4 can be increased. With this, the carrier mobility in the back channel region in the semiconductor layer 4 can be reduced.

Furthermore, since the interfacial layer 6 is interposed between the channel protective layer 5 and the semiconductor layer 4, as shown in FIG. 5B, the interfacial layer 6 serves as a barrier to prevent the fixed charges from moving from the channel protective layer 5 to the semiconductor layer 4 even when fixed charges are generated in the channel protective layer 5. With this, the impact of the fixed charges on the semiconductor layer 4 can be reduced.

As described above, in the thin-film semiconductor device 10 according to Embodiment 1 of the present invention, the interfacial layer 6 containing carbon as the major component is formed between the semiconductor layer 4 and the channel protective layer 5, it is possible to reduce the carrier mobility in the back channel region in the semiconductor layer 4 and to reduce the movement of the fixed charges from channel protective layer 5 to the semiconductor layer 4. With this, it is possible to control leakage current at the time of OFF, it is possible to increase OFF characteristics of the thin-film semiconductor device. In other words, the thin-film semiconductor device having the channel protective layer made of an organic material is believed to see more positive fixed charges and higher leakage current than the thin-film semiconductor device having the channel protective layer made of an inorganic material. In the present invention, the leakage current is controlled by forming the interfacial layer 6 including carbon as the major component between the semiconductor layer 4 and the channel protective layers.

Furthermore, since in the thin-film semiconductor device 10 according to the present embodiment, the channel protective layer 5 is formed with an organic material, the channel protective layer 5 can be formed at a low temperature and in a coating process. With this, it is possible to manufacture the thin-film semiconductor device having excellent TFT characteristics through a simple facility and at a low cost.

Moreover, in the thin-film semiconductor device 10, it is favorable that the carbon concentration included in the interfacial layer 6 is higher than or equal to $5 \times 10^{20}$ [atom/cm$^3$], and is 50 times or more higher than the carbon concentration as impurity included in the semiconductor layer 4. With this, an effect of reducing the above described carrier mobility in the interfacial layer 6 can be certainly developed.

Moreover, in the thin-film semiconductor device 10, it is favorable that sulfur is included in the interfacial layer 6. The sulfur included in the interfacial layer 6 is sulfur included in the photosensitive agent of the organic material in the channel protective layer film 5F. The sulfur included in the interfacial layer 6 originates from the organic material in the channel protective layer film 5F. Sulfur has an atomic radius larger than those of carbon and oxygen, and thus produces a larger effect of interrupting carrier transfer than those produced by carbon and oxygen. Accordingly, inclusion of sulfur in the interface layer 6 allows further reducing the carrier mobility as described above, thus further increasing the OFF characteristics of the thin-film semiconductor device.

Moreover, in the thin-film semiconductor device 10, it is favorable that the sulfur concentration included in the interfacial layer 6 is higher than or equal to $5 \times 10^{19}$ [atoms/cm$^3$], and is 100 times or more higher than the sulfur concentration as impurity included in the semiconductor layer 4. With this, an effect of reducing the above described carrier mobility in the interfacial layer 6 can be certainly developed.

Moreover, in the thin-film semiconductor device 10 according to the present embodiment, it is favorable that the interfacial layer 6 has insulation with the resistivity of the interfacial layer 6 of more than or equal to $2 \times 10^6$ [Ω·cm]. With this, the above described carrier mobility in the interfacial layer 6 can be further reduced.

Moreover, as shown in the present embodiment, it is favorable that hydrogen plasma treatment is performed on the crystalline silicon thin film 4p (semiconductor layer 4). In the thin-film semiconductor device using the crystalline silicon thin film as the semiconductor layer (channel layer), there are many dangling bonds in the grain boundary of silicon and inside the crystals, in the crystalline silicon thin film which is crystallized through annealing. The dangling bond traps the carrier as a defect and negatively affects the interface state, and degrades the carrier mobility or degrades ON and OFF characteristics, thus degrading the TFT characteristics of the thin-film semiconductor device. With this, in order to reduce the number of dangling bonds, it is favorable that the dangling bonds are hydrogen terminated using hydrogen plasma and the like. As described above, the hydrogen termination on the dangling bonds allows for reducing degradation in the TFT characteristics of the thin-film semiconductor device.

Furthermore, the hydrogen plasma treatment is performed on the crystalline silicon thin film 4p before the channel protective layer 5 is formed as shown in the present embodiment. In the present embodiment, the hydrogen plasma treatment is performed between a step of forming the polycrystalline silicon thin film and a step of forming the channel protective layer. The point will be described later.

First, the inventors and others found that when hydrogen plasma treatment is performed on the channel protective layer 5 made of an organic material, the generated hydrogen plasma removes carbon contained in the channel protective layer 5. In other words, they found that when hydrogen plasma treatment is performed on the channel protective layer 5 made of an organic material, the hydrogen plasmas (hydrogen) generated for performing hydrogen termination on the dangling bonds of silicon atoms in the crystalline silicon thin film are consumed by the channel protective layer 5, and the hydrogen plasmas fail to reach the crystalline silicon thin film in the semiconductor layer 4. Moreover, in this case, they found that when a photosensitizing agent (naphthoquinone diazide and the like) remains in the film of the channel protective layer 5, it is easy to make a reaction between the channel protective layer and the hydrogen plasma.

Meanwhile, it is found that when the channel protective layer is formed with an inorganic material such as silicon dioxide, hydrogen plasma due to hydrogen plasma treatment is not consumed by the inorganic material of the channel protective layer (silicon dioxide) and passes through the channel protective layer, with the result that hydrogen atoms reach the semiconductor layer below the channel protective layer.

Therefore, the inventors and others considered a sequence of steps for performing the hydrogen plasma treatment on the crystalline silicon thin film. The point will be described with reference to FIGS. 7A and 7B. FIG. 7A is a diagram showing a state of the semiconductor layer 4 before and after hydrogen plasma treatment, when the channel protective layer 5 is formed and then hydrogen plasma treatment is performed in the thin-film semiconductor device 10 according to Embodiment 1 of the present invention. FIG. 7B is a diagram showing a state of the semiconductor layer 4 before and after hydrogen plasma treatment, when hydrogen plasma treatment is performed before the channel protective layer 5 is formed in the thin-film semiconductor device 10 according to Embodiment 1 of the present invention.

First, the case where hydrogen plasma treatment is performed after the channel protective layer 5 is formed will be described with reference to FIG. 7A. As shown in FIG. 7A, before the hydrogen plasma treatment, the state of the semiconductor layer 4 (crystalline silicon thin film) below the channel protective layer 5 shows that defect density is $1.2 \times 10^{18}$ [spons/cm$^3$] and hydrogen concentration is less than or equal to 1 [%].

Subsequently, when hydrogenation process is performed with hydrogen plasma treatment, it is found that the state of the semiconductor layer 4 (crystalline silicon thin film) below the channel protective layer 5 shows that defect density is $1.9 \times 10^{17}$ [spons/cm$^3$], and hydrogen concentration is approximately 3 [%] and the number of dangling bonds is decreased and hydrogen termination is performed. Meanwhile, the state of the semiconductor layer 4 (crystalline silicon thin film) below the channel protective layer 5 shows that that defect density is $1.2 \times 10^{18}$ [spons/cm$^3$] and hydrogen concentration is approximately 1 [%], and the number of dangling bonds is unchanged from that before hydrogen plasma treatment. This is because as described above, it is believed that hydrogen plasma is consumed by carbon of the channel protective layer 5.

As described above, when hydrogen plasma treatment is performed after the channel protective layer 5 is formed, the state of hydrogenation in the semiconductor layer 4 is different between the region below the channel protective layer 5 and the region other than the region below the channel protective layer 5.

Conversely, as shown in FIG. 7B, when hydrogen plasma treatment is performed before the channel protective layer 5 is formed, the state of the semiconductor layer 4 (crystalline silicon thin film) before hydrogen plasma treatment shows that defect density is $1.2 \times 10^{18}$ [spons/cm$^3$] and hydrogen concentration is less than or equal to 1 [%]. However, the state of the semiconductor layer 4 (crystalline silicon thin film) after hydrogen plasma treatment shows that defect density is $1.9 \times 10^{17}$ [spons/cm$^3$] and hydrogen concentration is approximately 3 [%] and the number of dangling bonds is decreased in the whole region of the semiconductor layer 4 and hydrogen termination is performed.

Therefore, it is favorable that the process of hydrogen plasma treatment on the crystalline silicon thin film 4p is performed before the channel protective layer 5 is formed.

Figure 8A:
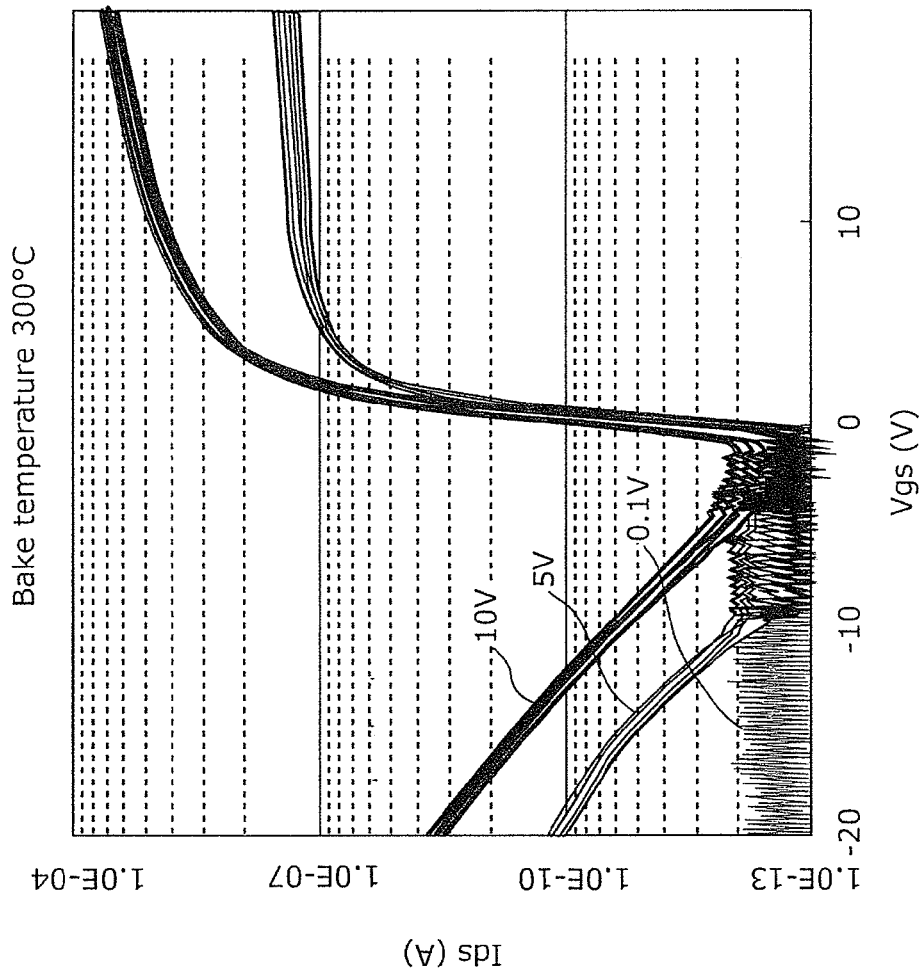
FIG. 8A is a diagram showing current-voltage characteristics of the thin-film semiconductor device at a bake temperature of 300° C.

Furthermore, it is favorable that the processes after the hydrogen plasma treatment are performed at the temperature of 300° C. or less in which hydrogen is not released from the semiconductor layer 4 (crystalline silicon thin film 4p). The point will be described with reference to FIGS. 8A and 8B. FIG. 8A is a diagram showing current-voltage characteristics of the thin-film semiconductor device at a bake temperature of 300° C. FIG. 8B is a diagram showing current-voltage characteristics of the thin-film semiconductor device at a bake temperature of 350° C. It is to be noted that in FIGS. 8A and 8B, a vertical axis shows a drain current and a horizontal axis shows a gate voltage. Moreover, in FIGS. 8A and 8B, 0.1 V, 5 V, and 10 V show bias between source and drain. In each of the drawings, current-voltage characteristics when the bias is applied are shown.

As shown in FIG. 8A, it is found that when the bake temperature when the channel protective layer film 5F is post-based is set to 300° C., excellent ON characteristics and OFF characteristics are obtained. Meanwhile, as shown in FIG. 8B, when the bake temperature is increased to 350° C., a subthreshold swing value (S value) is degraded and the TFT characteristics are degraded. It is to be noted that the S value is a value obtained by calculating the capacitance of the gate insulating film and the capacitance of the semiconductor layer. In this case, the capacitance of the semiconductor layer is changed according to the release of hydrogen from the semiconductor layer.

As shown in FIGS. 8A and 8B, when the bake temperature exceeds 300° C., hydrogen is released from the semiconductor layer and the number of dangling bonds is increased, with the result that the TFT characteristics are degraded. This is because when high-temperature treatment at a temperature more than 300° C. is performed after hydrogenation process is performed on dangling bonds with hydrogen plasma treatment, dangling bonds are generated again because the terminated hydrogen is released from the combination with silicon. It is to be noted similarly, after hydrogen plasma treatment is performed, it is not favorable that high-temperature treatment at a temperature more than 300° C. is performed when the process other than postbake is performed. Therefore, it is favorable that a temperature of less than or equal to 300° C. is maintained at the processes after the hydrogen plasma treatment.

As described above, when hydrogenation process is performed before the channel protective layer 5 is formed and the temperature in the subsequent processes is set at less than or equal to 300° C., the dangling bonds remain hydrogen terminated. With this, when the temperature in the heat process of the manufacturing steps after the channel protective layer 5 is formed is maintained at less than or equal to 300° C., it is possible to prevent the generation of dangling bonds again through the release of hydrogen. Therefore, it is possible to manufacture a channel protective thin-film semiconductor device with excellent carrier mobility and excellent ON and OFF characteristics in a simple manufacturing process and at a low temperature.

Figure 9:
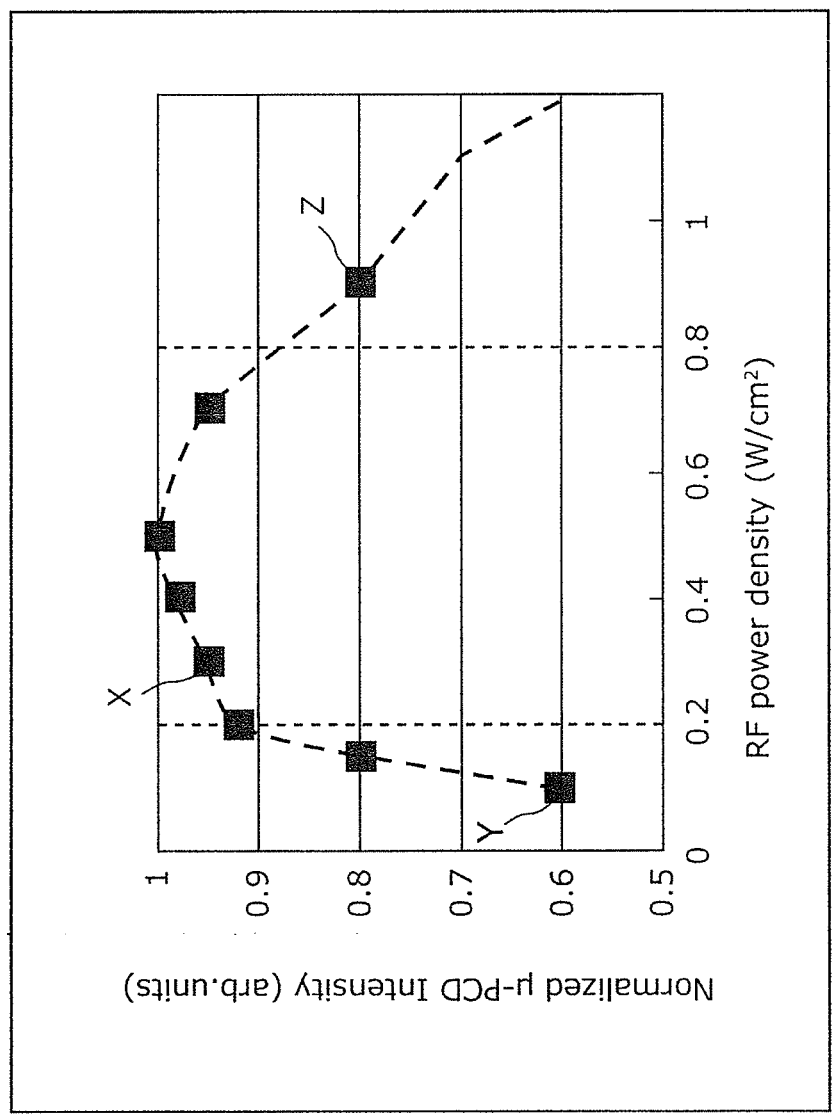
FIG. 9 is a graph showing measurement results when a carrier lifetime of the thin-film semiconductor device is measured according to a p-PCD method in the case where RF power density is changed.
Figure 10A:
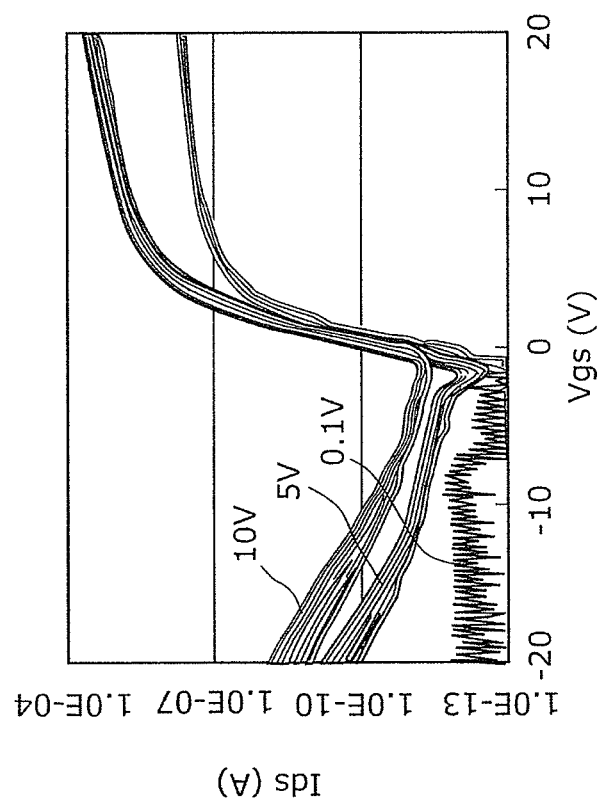
FIG. 10A is a graph showing current-voltage characteristics of the thin-film semiconductor device in a sample X in FIG. 9.
Figure 10B:
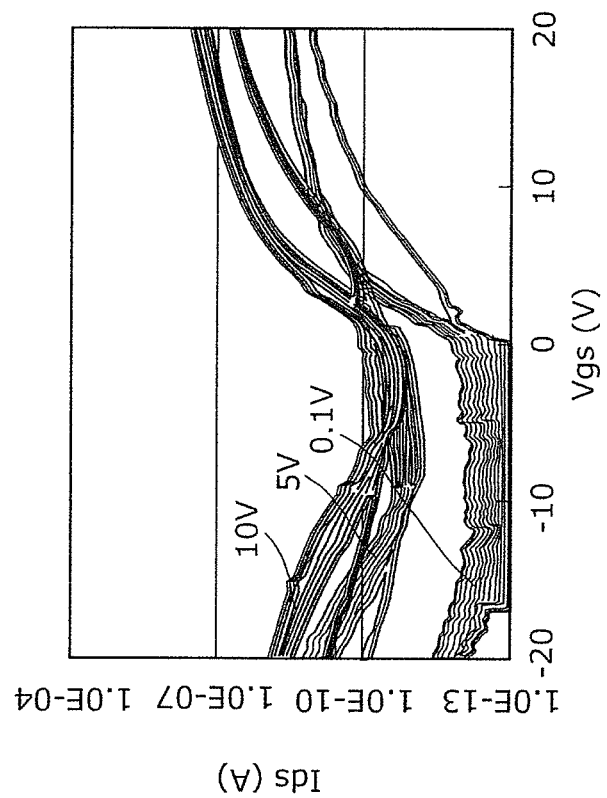
FIG. 10B is a graph showing current-voltage characteristics of the thin-film semiconductor device in a sample Y in FIG. 9.
Figure 10C:
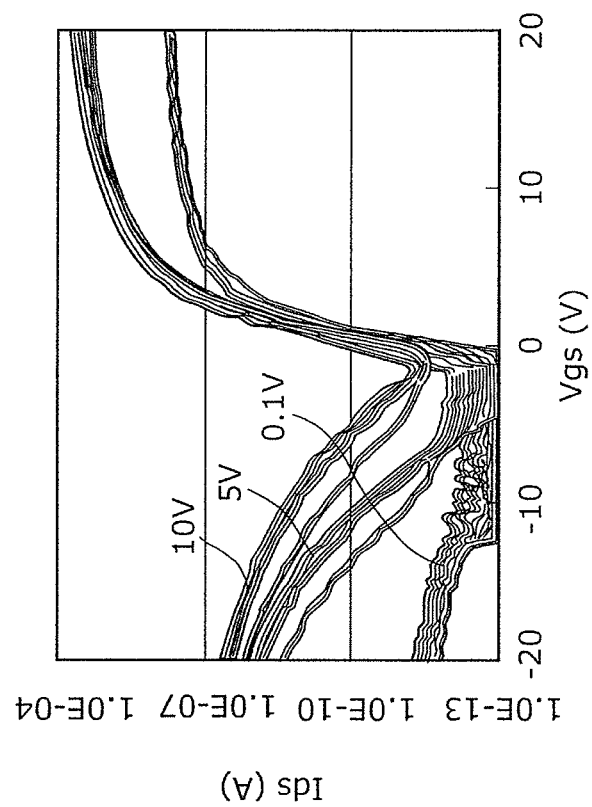
FIG. 10C is a graph showing current-voltage characteristics of the thin-film semiconductor device in a sample Z in FIG. 9.

Moreover, in the present embodiment, it is favorable that power density of injection power of radio frequency power in hydrogen plasma treatment is 0.2 to 0.8 [W/cm$^2$]. The point will be described with reference to FIG. 9, and FIGS. 10A and 10C. FIG. 9 is a graph showing measurement results when a carrier lifetime of the thin-film semiconductor device is measured according to a p-PCD method in the case where RF power density is changed. Moreover, FIGS. 10A to 10C are graphs showing current-voltage characteristics of the thin-film semiconductor device in the samples X, Y, and Z, respectively, in FIG. 9.

In FIG. 9, a vertical axis indicates intensity. When the value of intensity is higher, the carrier lifetime is longer. In other words, this indicates that the number of dangling bonds is small and defect density is low. A horizontal axis indicates power density of radio frequency power (RF power density) injected for hydrogen plasma treatment. It is to be noted that in FIGS. 10A to 10C, a vertical axis shows a drain current and a horizontal axis shows a gate voltage. Moreover, in FIGS. 10A and 10C, 0.1 V, 5 V, and 10 V show bias between source and drain. In each of the drawings, current-voltage characteristics when the bias is applied are shown.

As shown in FIG. 9, it is found that when the RF power density is increased, the carrier lifetime is longer. This is because when the RF power density is higher, the amount of generated hydrogen radical is increased, with the result that the crystalline silicon thin film is more hydrogenated.

Meanwhile, it is found that when the RF power density is too high, the carrier lifetime is short. This is because hydrogen radical etches the film of the semiconductor layer and the like, thus causing defect in the semiconductor layer and decreasing the lifetime.

When the current-voltage characteristics are measured for the thin-film semiconductor device in the samples X, Y, and Z in FIG. 9, as shown in FIG. 10A, the thin-film semiconductor device in the sample X are excellent in the ON characteristics and the OFF characteristics. Meanwhile, as shown in FIG. 10B, the thin-film semiconductor device in the sample Y sees decreases in the ON characteristics and the OFF characteristics. This is because hydrogenation is not performed and carrier mobility is not increased. Meanwhile, as shown in FIG. 10C, the thin-film semiconductor device in the sample Z shows that the ON characteristics are excellent and the OFF characteristics are decreased. This is because defect is formed in the film and leakage current caused by the defect is increased.

Therefore, as shown in the measurement results of p-PCD in FIG. 9, since the value of the vertical axis is 90% or higher considering the variation of lifetime and the margin, it is favorable that the RF power density in hydrogen plasma treatment is set at 0.2 to 0.8 [W/cm$^2$].

Figure 11:
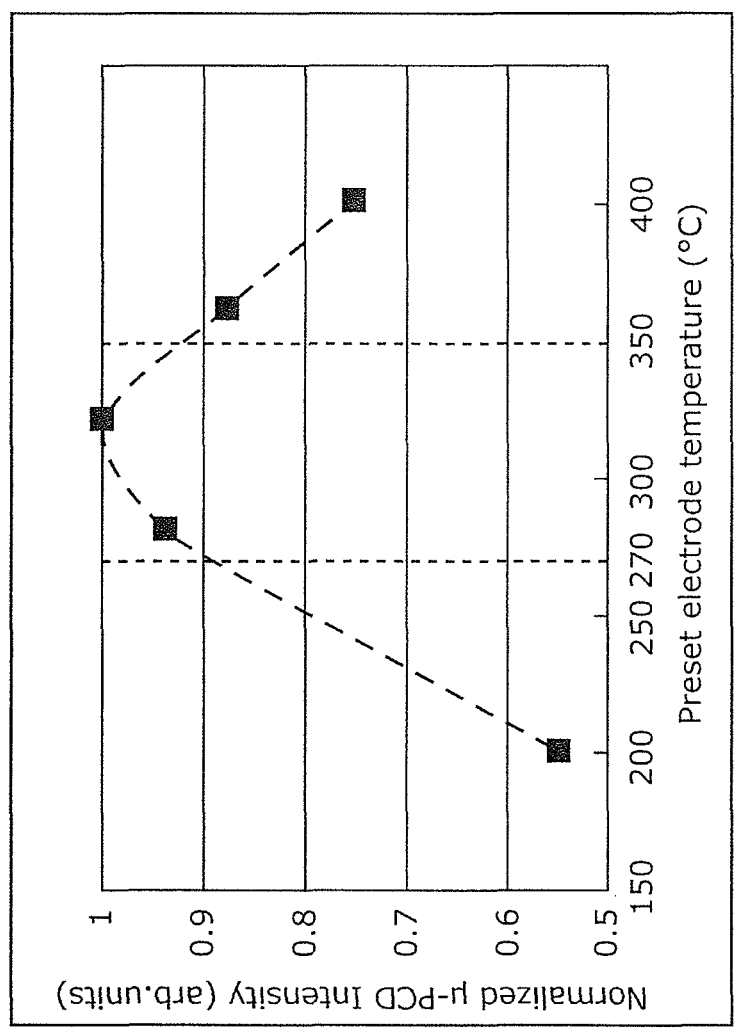
FIG. 11 is a graph showing measurement results when a carrier lifetime of the thin-film semiconductor device is measured according to a p-PCD method in the case where a preset electrode temperature in hydrogen plasma treatment is changed.

Furthermore, it is favorable that in the hydrogen plasma treatment, the preset temperature of the lower electrode is set from 250 to 350° C. The point will be described with reference to FIG. 11. FIG. 11 is a graph showing measurement results when a carrier lifetime of the thin-film semiconductor device is measured according to a μ-PCD method in the case where preset electrode temperature in hydrogen plasma treatment is changed.

In FIG. 11, a vertical axis indicates intensity. When the value of intensity is higher, the carrier lifetime is longer. Moreover, in FIG. 11, a horizontal axis shows the preset electrode temperature in hydrogen plasma treatment.

As shown in FIG. 11, since it is favorable that as similarly to FIG. 9, the value of the vertical axis is 90% or higher, the preset electrode temperature when hydrogen plasma is generated is set from 250 to 350° C.

Embodiment 2

Next, a thin-film semiconductor device 20 and a method for manufacturing the thin-film semiconductor device 20 according to Embodiment 2 of the present invention will be described.

(Configuration of Thin-Film Semiconductor Device 20)

Figure 12:
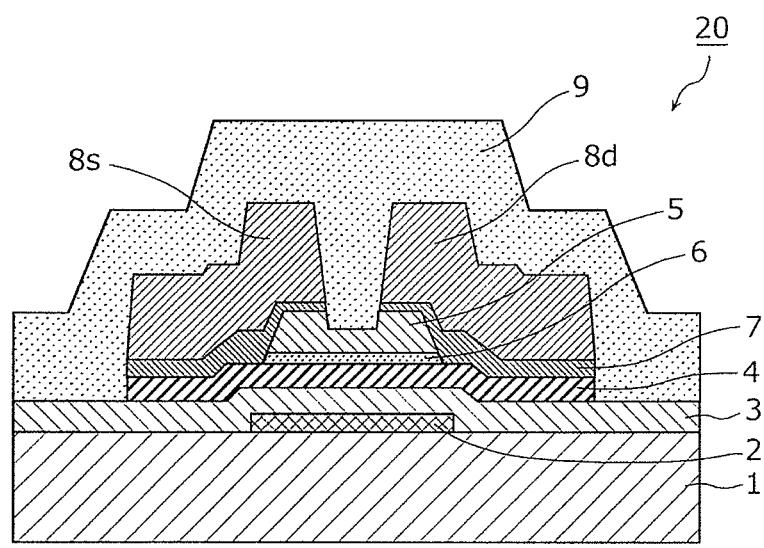
FIG. 12 is a cross-sectional view schematically illustrating a configuration of a thin-film semiconductor device according to Embodiment 2 of the present invention.

A configuration of the thin-film semiconductor device 20 according to Embodiment 2 of the present invention will be described with reference to FIG. 12. FIG. 12 is a cross-sectional view schematically illustrating the configuration of the thin-film semiconductor device 20 according to Embodiment 2 of the present invention. Moreover, in FIG. 12, the same numerals are assigned to the same structural elements as those shown in FIG. 1. A detailed description thereof will be omitted or simplified.

As shown in FIG. 12, the thin-film semiconductor device 20 according to Embodiment 2 of the present invention, as similarly to Embodiment 1, is a channel protective, bottom gate thin-film transistor device. The thin-film semiconductor device includes, a substrate 1, and the following layers sequentially formed above the glass substrate 1; a gate electrode 2, a gate insulating film 3, a semiconductor layer 4, a channel protective layer 5, an interfacial layer 6 formed between the semiconductor layer 4 and the channel protective layer 5, a pair of contact layers 7a and 7b formed above the semiconductor layer 4, a source electrode 8s and a drain electrode 8d which constitute a pair, and a passivation film 9.

The semiconductor layer 4 according to the present embodiment, as similarly to that in Embodiment 1, is a semiconductor layer formed above the gate insulating film 3, and has a channel region which is a region in which carrier movement is controlled by voltage at the gate electrode 2.

It is to be noted that a material used for the semiconductor layer 4 according to the present embodiment is different from the material used for the semiconductor layer 4 according to Embodiment 1. In other words, the semiconductor layer 4 according to Embodiment 1 is formed of crystalline silicon thin film, and the semiconductor layer 4 according to the present embodiment is formed of an oxide semiconductor layer. Specifically, the semiconductor layer 4 (oxide semiconductor layer) according to the present embodiment is formed of transparent amorphous oxide semiconductors (TAOS) such as $InGaZO_x$ (IGZO). Since the transparent amorphous oxide semiconductors are formed at a low temperature, they can be formed above a substrate made of plastic and film. It is to be noted that the material of TAOS film is not limited to a material of an InGaZnO group. For example, InZno, ZnO, InHfZnO, SnZnO, SnGaZnO, and the like are acceptable.

Moreover, the interfacial layer 6 according to the present embodiment, as similarly to that according to Embodiment 1, is formed in contact with the channel protective layer 5, and includes carbon as a major component. The carbon that is the major component is carbon originates from the organic material constituting the channel protective layer 5. Moreover, the interfacial layer 6 according to the present embodiment also includes sulfur. It is to be noted that the interfacial layer 6 according to the present embodiment, as similarly to that according to Embodiment 1, is generated when the channel protective layer 5 is heated and solidified.

It is to be noted that since the semiconductor layer 4 according to the present embodiment does not include silicon, the atomic bonding state of the interfacial layer 6 according to the present embodiment is slightly different from that in the interfacial layer 6 according to Embodiment 1. Also in the present embodiment, the carbon concentration in the interfacial layer 6 is higher than the carbon concentration in the channel protective layer 5.

It is to be noted that also in the present embodiment, it is favorable that the carbon concentration included in the interfacial layer 6 is greater than or equal to $5 \times 10^{20}$ [atoms/cm$^3$]. It is to be noted that also in the present embodiment, it is favorable that the sulfur concentration included in the interfacial layer 6 is greater than or equal to $5 \times 10^{19}$ [atoms/cm$^3$]. It is to be noted that it is favorable that resistivity of the interfacial layer 6 is greater than or equal to $2 \times 10^6$ [Ω·cm]. Moreover, it is favorable that the thickness of the interfacial layer 6 is from 1 nm to 5 nm.

Moreover, in the present embodiment, the passivation film 9 is formed above the channel protective layer 5, the source electrode 8s, and the drain electrode 8d to cover the whole of the channel protective layer 5, the source electrode 8s, and the drain electrode 8d. The passivation film 9 is an insulating film made of an inorganic material such as SiN, and is formed with plasma CVD and the like.

It is to be noted that in the present embodiment, the channel protective layer 5 is formed only above the channel region of the semiconductor layer 4.

(Method for Manufacturing Thin-Film Semiconductor Device 20)

Figure 13A:
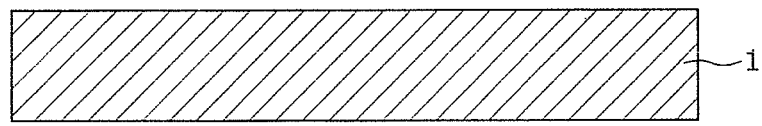
FIG. 13A is a cross-sectional view schematically illustrating a base preparation step in a method for manufacturing the thin-film semiconductor device according to Embodiment 2 of the present invention.
Figure 13B:
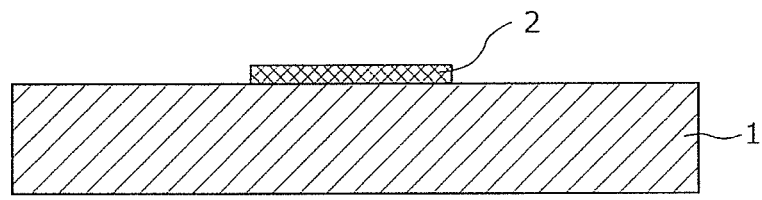
FIG. 13B is a cross-sectional view schematically illustrating a gate electrode formation step in a method for manufacturing the thin-film semiconductor device according to Embodiment 2 of the present invention.
Figure 13C:
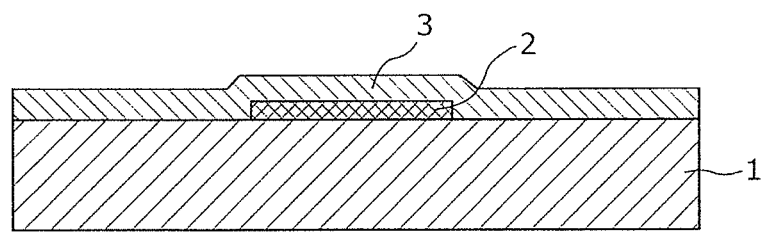
FIG. 13C is a cross-sectional view schematically illustrating a gate insulating formation step in a method for manufacturing the thin-film semiconductor device according to Embodiment 2 of the present invention.
Figure 13D:
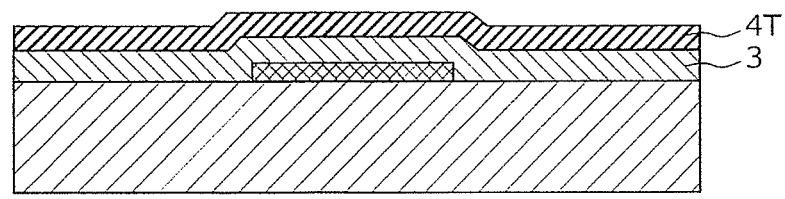
FIG. 13D is a cross-sectional view schematically illustrating a semiconductor layer (transparent amorphous oxide semiconductor) formation step in a method for manufacturing the thin-film semiconductor device according to Embodiment 2 of the present invention.
Figure 13E:
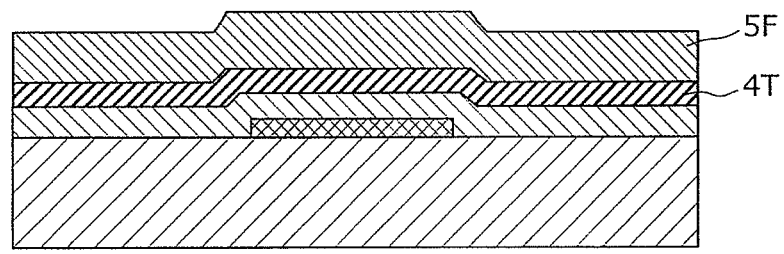
FIG. 13E is a cross-sectional view schematically illustrating a channel protective layer film formation step in a method for manufacturing the thin-film semiconductor device according to Embodiment 2 of the present invention.
Figure 13F:
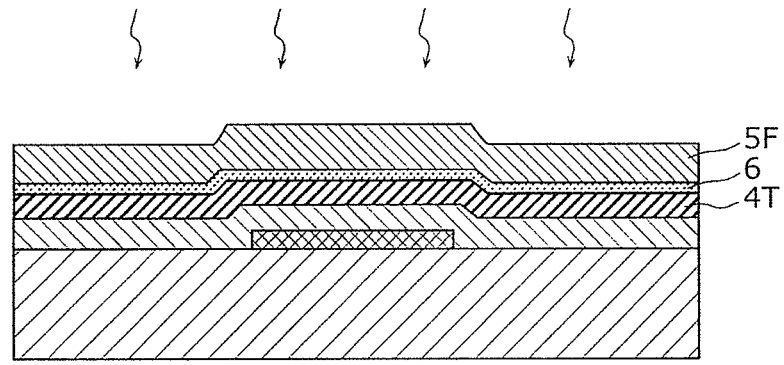
FIG. 13F is a cross-sectional view schematically illustrating a prebake step of a channel protective layer film in a method for manufacturing the thin-film semiconductor device according to Embodiment 2 of the present invention.
Figure 13G:
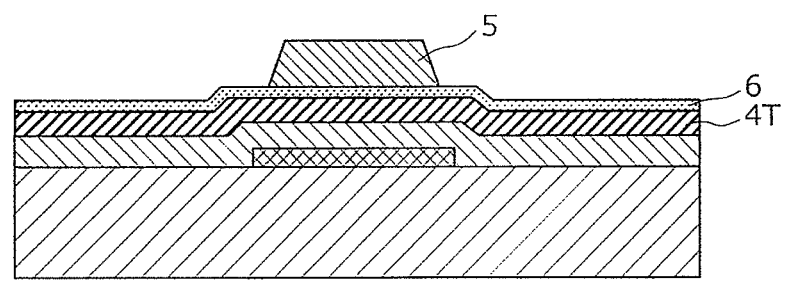
FIG. 13G is a cross-sectional view schematically illustrating a channel protective layer patterning step in a method for manufacturing the thin-film semiconductor device according to Embodiment 2 of the present invention.
Figure 13H:
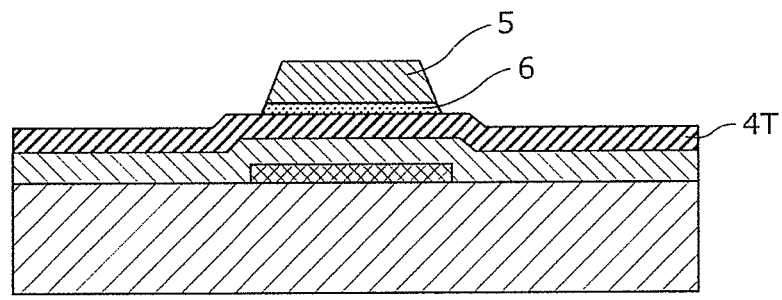
FIG. 13H is a cross-sectional view schematically illustrating an interfacial layer removal step in a method for manufacturing the thin-film semiconductor device according to Embodiment 2 of the present invention.
Figure 13I:
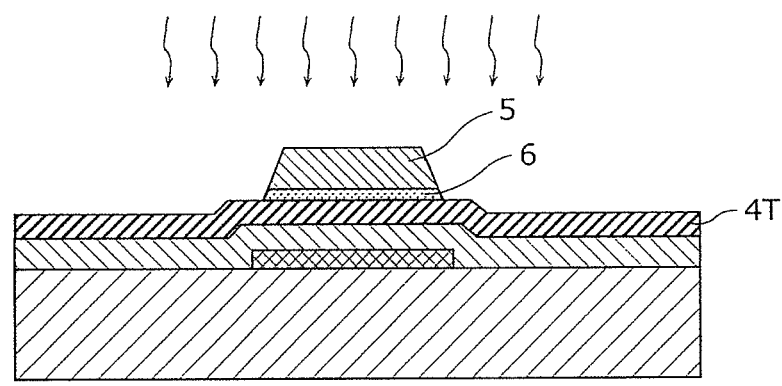
FIG. 13I is a cross-sectional view schematically illustrating a postbake step of a channel protective layer in a method for manufacturing the thin-film semiconductor device according to Embodiment 2 of the present invention.
Figure 13J:
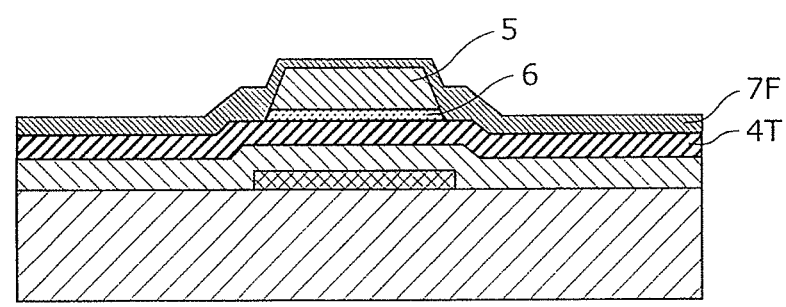
FIG. 13J is a cross-sectional view schematically illustrating a contact layer film formation step in a method for manufacturing the thin-film semiconductor device according to Embodiment 2 of the present invention.
Figure 13K:
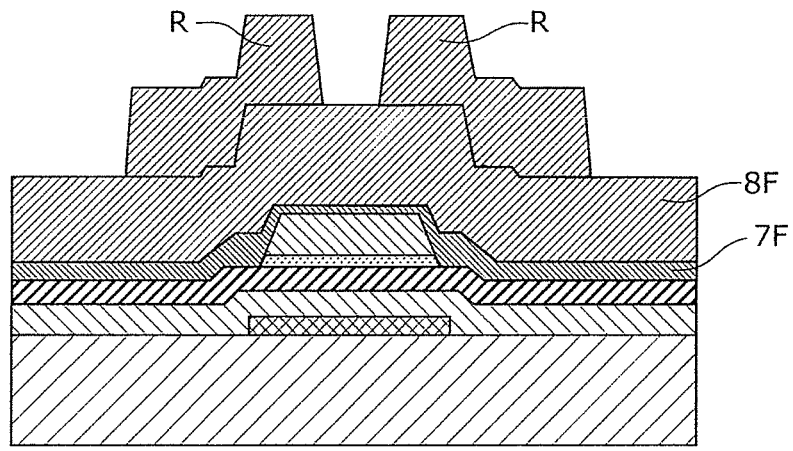
FIG. 13K is a cross-sectional view schematically illustrating a source-drain metal film formation step in a method for manufacturing the thin-film semiconductor device according to Embodiment 2 of the present invention.
Figure 13L:
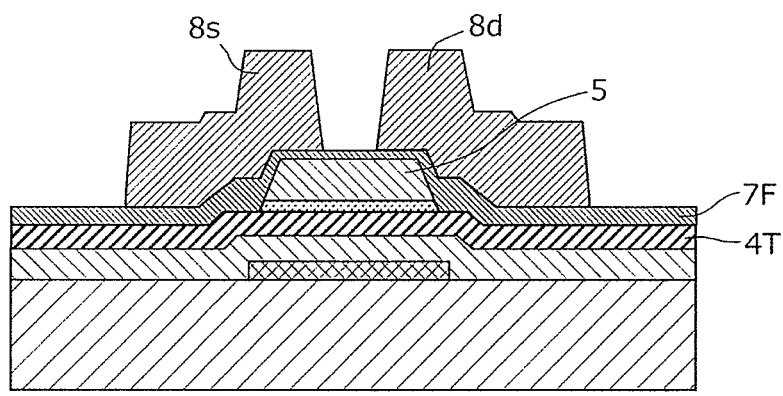
FIG. 13L is a cross-sectional view schematically illustrating a patterning step of a source electrode and a drain electrode in a method for manufacturing the thin-film semiconductor device according to Embodiment 2 of the present invention.
Figure 13M:
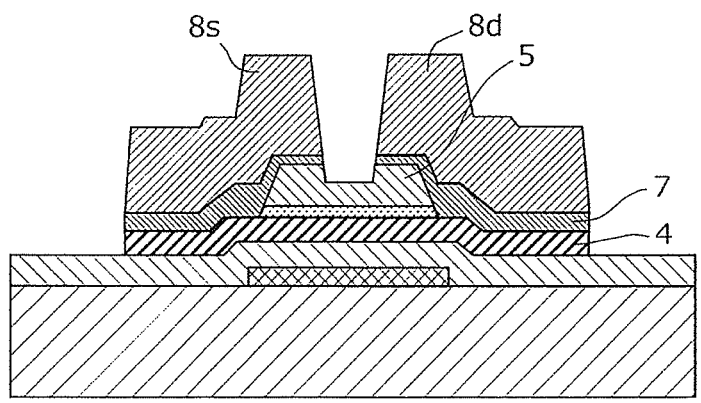
FIG. 13M is a cross-sectional view schematically illustrating a patterning step of a contact layer and a semiconductor layer in a method for manufacturing the thin-film semiconductor device according to Embodiment 2 of the present invention.
Figure 13N:
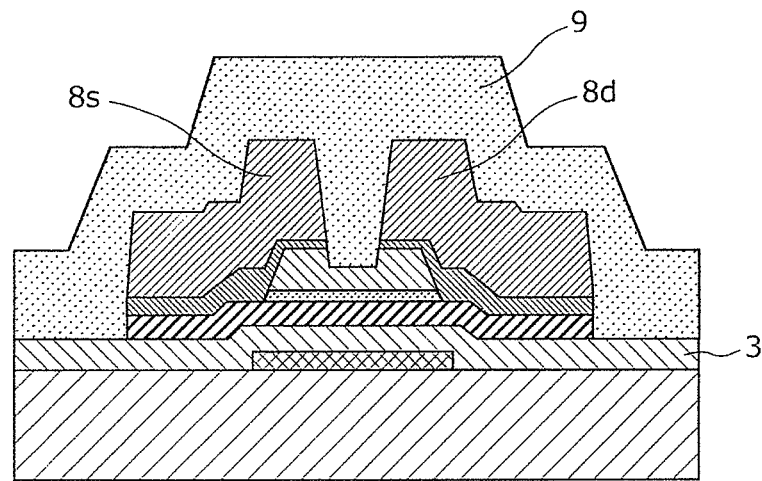
FIG. 13N is a cross-sectional view schematically illustrating a passivation film formation step in a method for manufacturing the thin-film semiconductor device according to Embodiment 2 of the present invention.
Figure 13O:
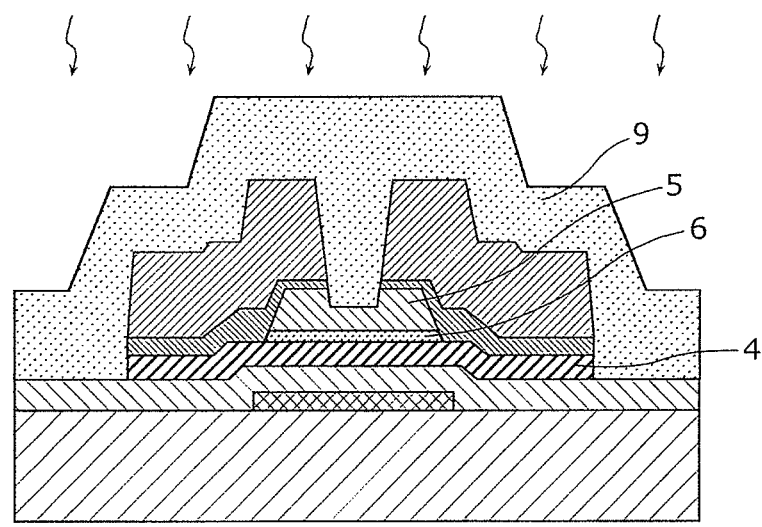
FIG. 13O is a cross-sectional view schematically illustrating an annealing step in a method for manufacturing the thin-film semiconductor device according to Embodiment 2 of the present invention.

The following will describe a method for manufacturing the thin-film semiconductor device 20 according to Embodiment 2 of the present invention with reference to FIGS. 13A to 13O. FIGS. 13A to 13O each are a cross-sectional view schematically illustrating the steps in the method for manufacturing the thin-film semiconductor device 20 according to Embodiment 2 of the present invention.

First, as shown in FIGS. 13A to 13C, as similarly to FIGS. 3A to 3C in Embodiment 1, the glass substrate is prepared as the substrate 1 (FIG. 13A), the gate electrode 2 in a predetermined shape is formed above the substrate 1 (FIG. 13B), and the gate insulating film 3 is formed to cover the gate electrode 2 (FIG. 13C).

Next, as shown in FIG. 13D, a transparent amorphous oxide semiconductor 4T of IGZO and the like is formed above the gate insulating film 3.

Next, as shown in FIGS. 13E and 13F, as similarly to FIGS. 3G and 3H in Embodiment 1, a channel protective layer film 5F is formed above the transparent amorphous oxide semiconductor 4T (FIG. 3G), and the channel protective layer film 5F is prebaked (FIG. 3H). At this time, the interfacial layer 6 is formed at the interface between the transparent amorphous oxide semiconductor 4T and the channel protective layer film 5F. The generated interfacial layer 6, as similarly to that according to Embodiment 1, includes carbon as a major component, and the carbon that is the major component is carbon originating from the organic material of the channel protective layer film 5F.

Next, as shown in FIGS. 13G to 13L, as similarly to FIGS. 3I and 3N in Embodiment 1, the channel protective layer 5 in a predetermined shape is formed by performing exposure and development on the channel protective layer film 5F (FIG. 13G), the exposed interfacial layer 6 is removed (FIG. 13H), the channel protective layer 5 is post-baked (FIG. 13I), a contact layer film 7F is formed above the transparent amorphous oxide semiconductor 4T to cover the channel protective layer 5 (FIG. 13J), a source-drain metal film 8F is formed above the contact layer film 7F (FIG. 13K), and the source electrode 8s and the drain electrode 8d in predetermined shapes are patterned using resist R (FIG. 13L).

Next, as shown in FIG. 13M, a pair of contact layers 7 and the semiconductor layer 4 is formed by patterning, in an insular shape, the contact layer film 7F and the transparent amorphous oxide semiconductor 4T.

Next, as shown in FIG. 13N, the passivation film 9 composed of SiN and the like as an insulating film is farmed above the channel protective layer 5, the source electrode 8s, and the drain electrode 8d to cover the whole surface of the channel protective layer 5, the source electrode 8s, and the drain electrode 8d.

Next, as shown in FIG. 13O, annealing is performed to stabilize oxygen contained in the semiconductor layer 4

(transparent amorphous oxide semiconductor). For example, annealing is performed for one hour in atmosphere (in an oxygen atmosphere) at a temperature from 300 to 350° C. With this, oxygen in the atmosphere is introduced into the transparent amorphous oxide semiconductor and the oxygen deficiency in the transparent amorphous oxide semiconductor is overcome, and then a reliable semiconductor layer 4 (transparent amorphous oxide semiconductor) can be obtained.

In this way, the thin-film semiconductor device 20 according to Embodiment 2 of the present invention can be manufactured.

It is to be noted that also in the present embodiment, the portion of the interfacial layer 6 which is not covered with the channel protective layer 5 does not have to be removed. Moreover, in the present embodiment, annealing is performed to stabilize the semiconductor layer 4 (transparent amorphous oxide semiconductor) after the passivation film 9 is formed. However, annealing is not limited to such. It is to be noted that it is favorable that annealing for stabilizing the semiconductor layer 4 is performed after the passivation film 9 is formed.

(Operational Effect of Thin-Film Semiconductor Device 20)

Figure 14A:
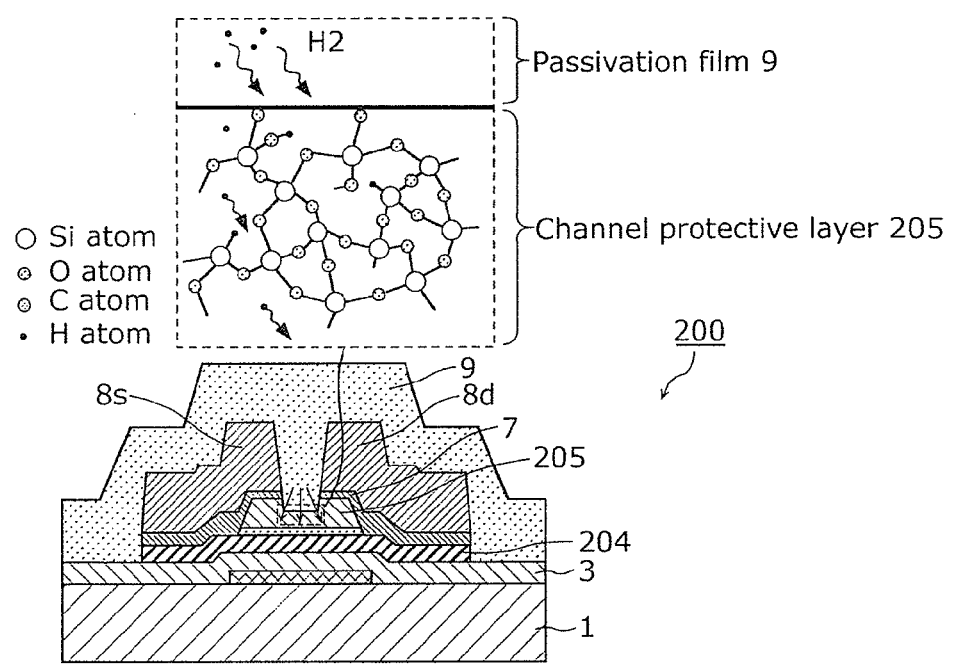
FIG. 14A is a diagram for explaining an operation of a thin-film semiconductor device, using oxide semiconductor in a semiconductor layer, according to a conventional example.
Figure 14B:
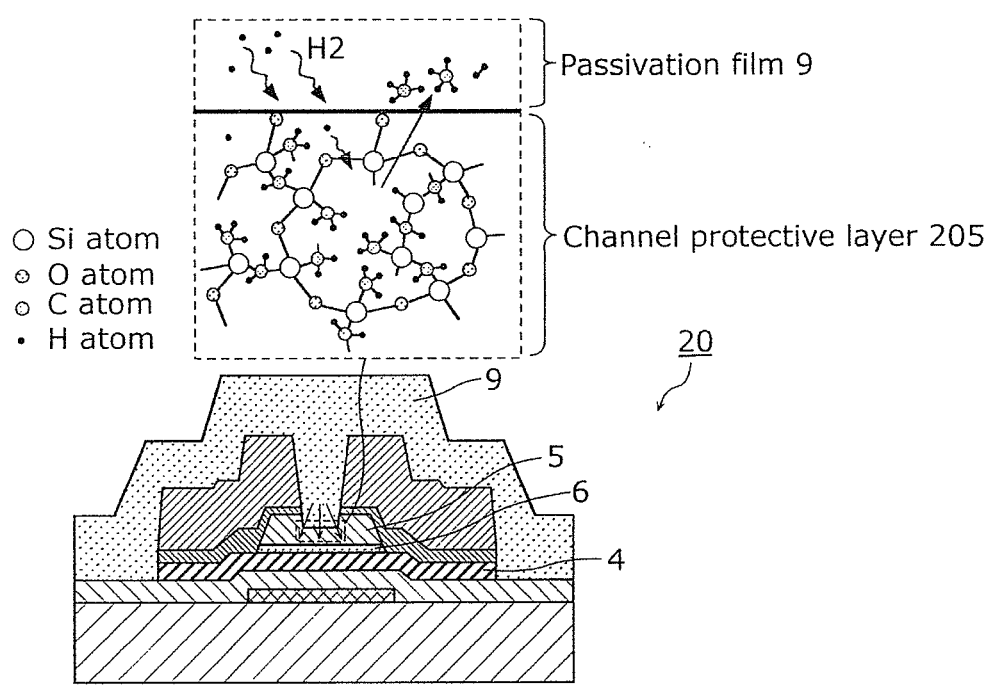
FIG. 14B is a diagram for explaining an operation of a thin-film semiconductor device according to Embodiment 2 of the present invention.

Next, an operational effect of the thin-film semiconductor device 10 according to the present embodiment will be described with reference to FIGS. 14A and 14B. FIG. 14A is a diagram for explaining an operation of the thin-film semiconductor device 200 according to a conventional example. FIG. 14B is a diagram for explaining an operation of the thin-film semiconductor device 20 according to Embodiment 2 of the present invention shown in FIG. 12.

As shown in FIG. 14A, the thin-film semiconductor device 200 according to the conventional example includes a semiconductor layer 204 made of the transparent amorphous oxide semiconductor, a channel protective layer 205 made of silicon oxide (inorganic material) formed above the semiconductor layer 204, and a passivation film 209 made of SiN which is formed to cover the whole surface.

It is to be noted that the generally, the semiconductor layer (channel layer) in the thin-film semiconductor device is formed with a silicon thin film as shown in Embodiment 1. The semiconductor layer made of silicon is composed of a silicon atom or a pair of silicon and hydrogen atoms when hydrogen termination is performed.

Meanwhile, as shown in the thin-film semiconductor device 200 in FIG. 14A, when the semiconductor layer 204 is composed of the oxide semiconductor layer, the semiconductor 204 is composed of more elements than the semiconductor made of silicon. For example, the semiconductor layer made of IGZO is composed of the four elements of indium (In), gallium (Ga), zinc (Zn), and oxygen (O). Therefore, the problem of the variation in elements the semiconductor layer composed of the oxide semiconductor layer is larger than the semiconductor layer made of silicon. Especially, hydrogen as impurity and oxygen deficiency due to hydrogen reduction are large problems, thus affecting the TFT characteristics.

For example, as shown in FIG. 14A, when the passivation film 9 is formed through forming SiN with plasma CVD, the passivation film 9 includes hydrogen and therefore hydrogen in the passivation film 9 diffuses through a heating process for stabilizing oxygen content in the transparent amorphous oxide semiconductor comprising the semiconductor layer 204. At this time, as shown in FIG. 14A, when the channel protective layer 205 is composed of an inorganic material such as silicon oxide, hydrogen in the passivation film 9 passes through the channel protective layer 205 and diffuses in the semiconductor layer 204. With this, hydrogen reduction is performed on the transparent amorphous oxide semiconductor comprising the semiconductor layer 204, and oxygen deficiency is generated in the transparent amorphous oxide semiconductor. As a result, the TFT characteristics are degraded by the shift of a threshold voltage and the reliability is degraded due to the non-function as TFT.

Meanwhile, as described in Embodiment 1, the inventors and others found that when hydrogen plasma treatment is performed on the coated channel protective layer 5 made of an organic material, the generated hydrogen plasma removes carbon contained in the channel protective layer 5. In other words, they have found that hydrogen plasma (hydrogen) is consumed by the channel protective layer 5 made of an organic material. With this, they gained the knowledge that the coated channel protective layer 5 made of an organic material can reduce diffusion of hydrogen plasma (hydrogen atom).

The inventors and others, based on the knowledge, have got the idea that by forming a coated channel protective layer made of an organic material in the thin-film semiconductor device composed of the semiconductor layer made of transparent amorphous oxide semiconductor, it is possible to prevent oxygen deficiency due to hydrogen reduction on the transparent amorphous oxide semiconductor. In other words, they have got the new idea that the channel protective layer made of an organic materials plays a role to protect the semiconductor layer from etching and a role to prevent hydrogen barrier from diffusing.

For example, as shown in FIG. 14B, since in the thin-film semiconductor device 20 according to the present embodiment, the channel protective layer 5 is made of an organic material including carbon, hydrogen from the passivation film 9 is consumed for removing carbon in the channel protective layer 5. With this, since it is possible to reduce the passing of hydrogen of the passivation film 9 through the channel protective layer 5, it is possible to reduce the diffusion of hydrogen into the semiconductor layer 4. As a result, since hydrogen reduction is not performed on the transparent amorphous oxide semiconductor comprising the semiconductor layer 4, oxygen deficiency is not generated in the transparent amorphous oxide semiconductor. Therefore, it is possible to reduce the degradation of TFT characteristics and the decrease in reliability by a shift of a threshold voltage.

As described above, since in the thin-film semiconductor device 20 according to Embodiment 2 of the present invention, the coated channel protective layer 5 made of an organic material functions as an etching protective layer and a hydrogen barrier prevention layer, it is possible to reduce hydrogen reduction on transparent amorphous oxide semiconductor comprising the semiconductor layer 4. With this, it is possible to reduce oxygen deficiency in the transparent amorphous oxide semiconductor, and therefore it is possible to reduce the degradation in TFT characteristics and the decrease in reliability.

Furthermore, in the present embodiment, as similarly to Embodiment 1, the interfacial layer 6 is formed at the interface between the channel protective layer 5 and the semiconductor layer 4. As described above, there is a difference in carbon concentration between the bulk channel protective layer 5 and the interfacial layer 6. The carbon concentration in the interfacial layer 6 is higher than that in the channel protective layer 5. Generally, the diffusion phenomenon occurs from a region having high concentration to a region having low concentration, and therefore it is believed that hydrogen diffuses from the interfacial layer 6 having high carbon concentration to the channel protective layer 5 having low carbon concentration. In other words, it is predicted that by forming the interfacial layer 6, hydrogen diffusion from the interfacial layer 6 to the semiconductor layer 4 can be reduced. In this way, by forming the interfacial layer 6, hydrogen reduction on the semiconductor layer 4 made of transparent amorphous oxide semiconductor can be further reduced.

Furthermore, in the present embodiment, the length of the semiconductor layer 4 in a gate longitudinal direction is greater than the lengths of the gate electrode 2 and the channel protective layer 5 in a gate longitudinal direction, and both end portions of the semiconductor layer 4 are the portions in which the channel protective layer 5 (gate electrode 5) is not formed. In other words, the semiconductor layer 4 is composed of a central portion in which the channel protective layer 5 is formed above the upper side and a side portion in which the channel protective layer is not formed above the upper side (both end portions of the central portion). The side portion functions as a contact portion between (i) the source electrode 8s and the drain electrode 8d and (ii) the channel region. Since the channel protective layer 5 is not formed above the side portion, the side portion is affected by hydrogen diffusion, with the result that hydrogen reduction is performed on the transparent amorphous oxide semiconductor in the side portion and oxygen deficiency occurs. With this, since the carrier concentration in the side portion can be higher, resistance at the transparent amorphous oxide semiconductor in the side portion can be reduced. With this, since the contact resistance in the side portion can be reduced, it is possible to realize a thin-film semiconductor device having excellent ON characteristics.

As described above, in the present embodiment, the carrier concentration in a portion (side portion) in which the channel protective layer 5 in the semiconductor layer 4 is not formed is higher than the carrier concentration in a portion (central portion) in which the channel protective layer 5 in the semiconductor layer 4 is formed. In this case, the carrier concentration in the side portion of the semiconductor layer 4 is greater than or equal to $1 \times 10^{17}$ [atoms/cm$^3$] and the carrier concentration in the central portion of the semiconductor layer 4 is less than $1 \times 10^{17}$ [atoms/cm$^3$]. With this, since the resistance value in a portion in which the protective layer in the oxide semiconductor layer is not formed can be close to the resistance value of metal, the resistance at the portion in which the protective layer in the oxide semiconductor layer is not formed can be reduced.

Moreover, in the present embodiment, the difference in carrier concentration between the central portion and the side portion of the semiconductor layer 4 is, for example, caused by hydrogen diffusion in the passivation film 9 in the annealing process for stabilizing oxygen contained in the semiconductor layer 4 (transparent amorphous oxide semiconductor). However, the difference in carrier concentration is not caused by such.

Figure 15:
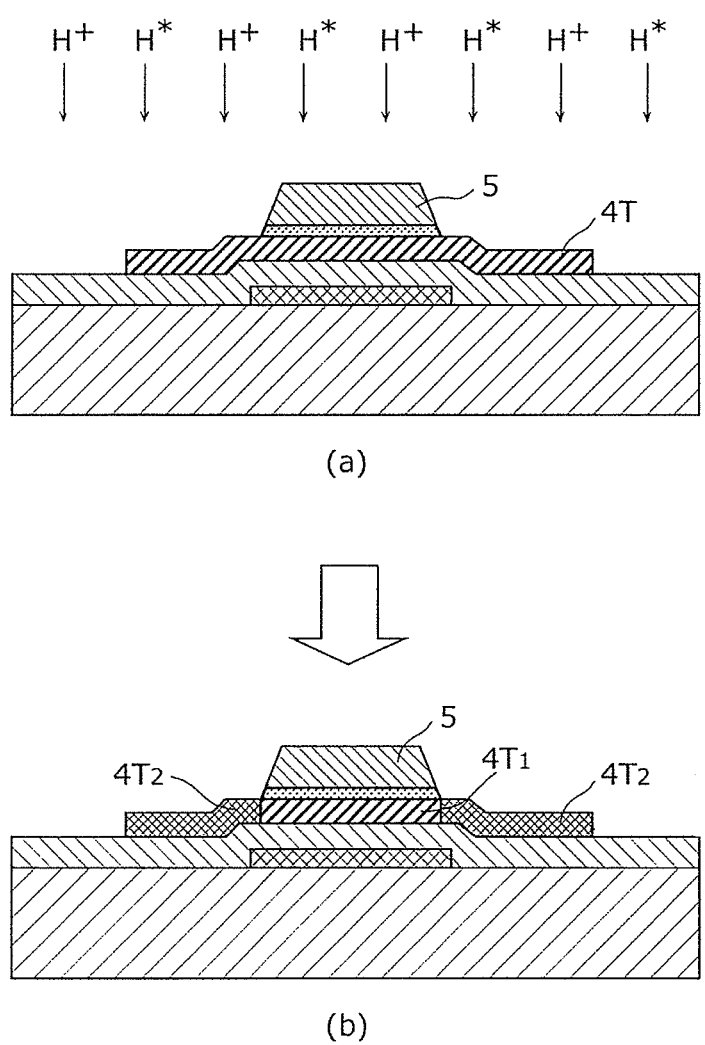
FIG. 15 is a diagram for explaining a method for manufacturing a thin-film semiconductor device according to Modification of Embodiment 2 of the present invention.

For examples in (h) in FIG. 15, by performing hydrogen plasma treatment, as shown in (a) in FIG. 15, after the channel protective layer 5 in a predetermined shape is patterned above the semiconductor layer 4 (transparent amorphous oxide semiconductor 4T), it is possible to generate the difference in carrier concentration between the central portion 4T$_1$ and the side portion 4T$_2$ in the semiconductor layer 4 through hydrogen plasma treatment. In other words, since hydrogen plasma (hydrogen) is consumed in the portion in which the channel protective layer 5 exists by the channel protective layer 5, hydrogen reduction is not performed on the semiconductor layer 4 below the channel protective layer 5 (or hydrogen reduction is reduced). Meanwhile, hydrogen plasma (hydrogen) reaches the portion in which the channel protective layer 5 does not exist, and hydrogen reduction is performed on the semiconductor layer 4. With this, the carrier concentration difference can be intentionally set between the central portion and the side portion in the semiconductor layer 4. In this way, by forming the channel protective layer 5 above part of the semiconductor layer 4, it is possible to have a carrier concentration difference in self alignment between the portion (side portion) in which the channel protective layer 5 in the semiconductor layer 4 is not formed and the portion (central portion) in which the channel protective layer 5 in the semiconductor layer 4 is formed. It is to be noted that in FIG. 15, the channel protective layer 5 is formed only above the channel region of the semiconductor layer 4. In other words, it is possible to generate the carrier concentration difference in self alignment in and out of the channel region of the semiconductor layer 4. It is to be noted that a method for forming distribution of carrier concentration with hydrogen plasma treatment is described here. However, by optimizing the film formation condition when a source-drain electrode is formed after the process in FIG. 13H, damage (defect) is caused on the portion (source-drain region) which is not covered with the protective film and it is possible to reduce resistance in the source-drain region.

Figure 16:
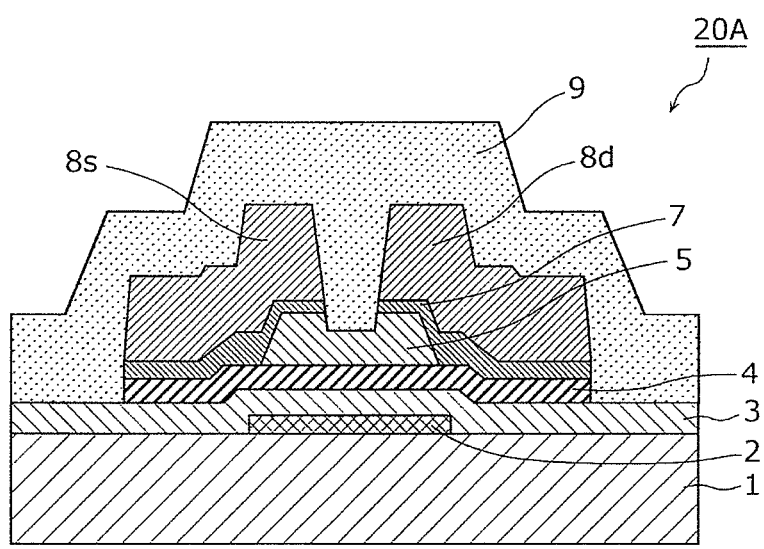
FIG. 16 is a cross-sectional view schematically illustrating a thin-film semiconductor device according to another Modification of Embodiment 2 of the present invention.

Moreover, in the present embodiment, the interfacial layer 6 is formed. However, as shown in FIG. 16, the interfacial layer 6 does not necessarily have to be formed. This is because it is believed that since TAOS has a greater band gap than Si, and a degradation in OFF characteristics caused by back channel conduction is unlikely to take place. It should be noted that by forming the interfacial layer 6, hydrogen reduction in the semiconductor layer 4 made of an oxide semiconductor can be further reduced compared with the case where the interfacial layer 6 is not formed. Furthermore, since it is possible, by the interfacial layer 6, to reduce excessive carbon diffusion from the channel protective layer 5, it is possible to reduce an impurity state in the oxide semiconductor in the semiconductor layer 4. With this, since it is possible to reduce leakage current at the time of OFF, it is possible to increase OFF characteristics.

Moreover, in the present embodiment as similarly to Embodiment 1, it is favorable that the carbon concentration included in the interfacial layer 6 is higher than or equal to $5 \times 10^{20}$ [atoms/cm$^3$], and is 50 times or more higher than the carbon concentration as impurity included in the semiconductor layer 4. With this, since an impurity state in the oxide semiconductor can be further reduced, it is possible to further reduce leakage current.

Moreover, in the present embodiment, as similarly to Embodiment 1, it is favorable that sulfur is included in the interfacial layer 6. The sulfur included in the interfacial layer 6 is sulfur included in the photosensitizing agent of the organic material in the channel protective layer film 5F. With this, as similarly to Embodiment 1, it is possible to further reduce leakage current, and it is possible to further increase the OFF characteristics of the thin-film semiconductor device.

Moreover, in the present embodiment, as similarly to Embodiment 1, it is favorable that the sulfur concentration included in the interfacial layer 6 is greater than or equal to $5 \times 10^{19}$ [Atoms/cm$^3$], and is 100 times or more higher than the sulfur concentration as impurity included in the semiconductor layer 4. With this, leakage current can be further reduced.

Moreover, in the present embodiment, as similarly to Embodiment 1, it is favorable that the interfacial layer 6 has insulation with the resistivity of the interfacial layer 6 of more than or equal to $2 \times 10^6$ [Ω·cm]. With this, leakage current can be further reduced.

Moreover, in the present embodiment, as similarly to Embodiment 1, the channel protective layer 5 is formed of an inorganic material. With this, since it is possible to form the channel protective layer 5 at a low temperature and a coating process, it is possible to obtain the thin-film semiconductor device having excellent TFT characteristics through a simple facility and at a low cost.

Embodiment 3

A display device according to Embodiment 3 of the present invention will be described with reference to FIG. 17. The present embodiment is an example of the case where the thin-film semiconductor device according to Embodiments 1 and 2 to the display device. It is to be noted that in the present embodiment, an example of an application to an organic EL display apparatus will be described.

Figure 17:
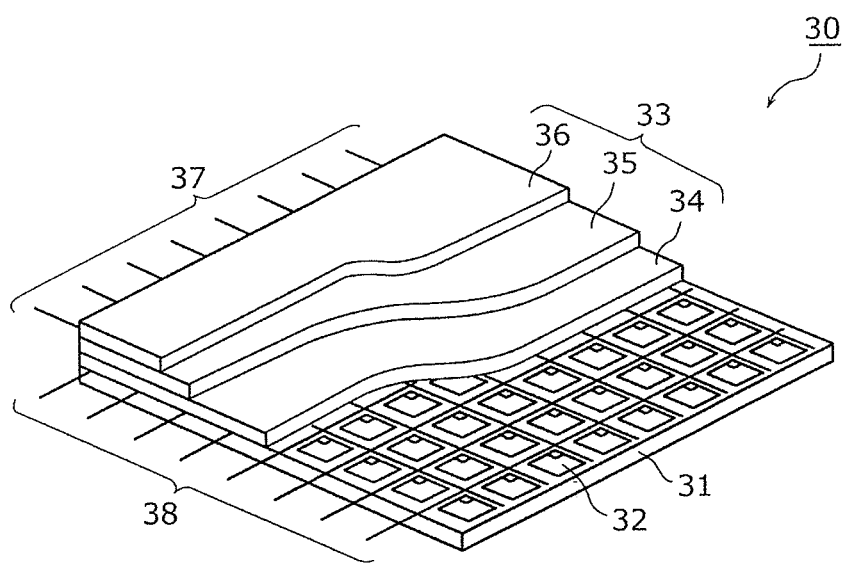
FIG. 17 is a partial cutout perspective view of an organic EL display according to Embodiment 3 of the present invention.

FIG. 17 is a partial cutout perspective view of an organic EL display device according to Embodiment 3 of the present invention. In the present embodiment, the above described thin-film semiconductor device 10 and the like can be used as a switching transistor or a driving transistor on an active matrix substrate in the organic EL display apparatus.

As shown in FIG. 17, an organic EL display apparatus 30 according to the present embodiment includes, an active matrix substrate 31, a plurality of pixels disposed in matrix on the active matrix substrate 31, an organic EL device 33 formed corresponding to each of the pixels 32, a plurality of gate lines 37 formed along a row direction of the pixels 32, a plurality of source lines 38 formed along a column direction of the pixels 32, and a power source line 39 (not illustrated) formed in parallel with the source line 38. The organic EL device 33 includes an anode 34, an organic EL layer 35, and a cathode 36 (transparent electrode) that are sequentially stacked above the active matrix substrate 31. Moreover, the organic EL layer 35 is composed of an electron transport layer, a light emitting layer, a hole transport layer, and others stacked.

It is to be noted that the organic EL display apparatus 20 according to the present embodiment is provided with a thin-film semiconductor device 10 as a switching transistor for selecting the pixels 22.

Figure 18:
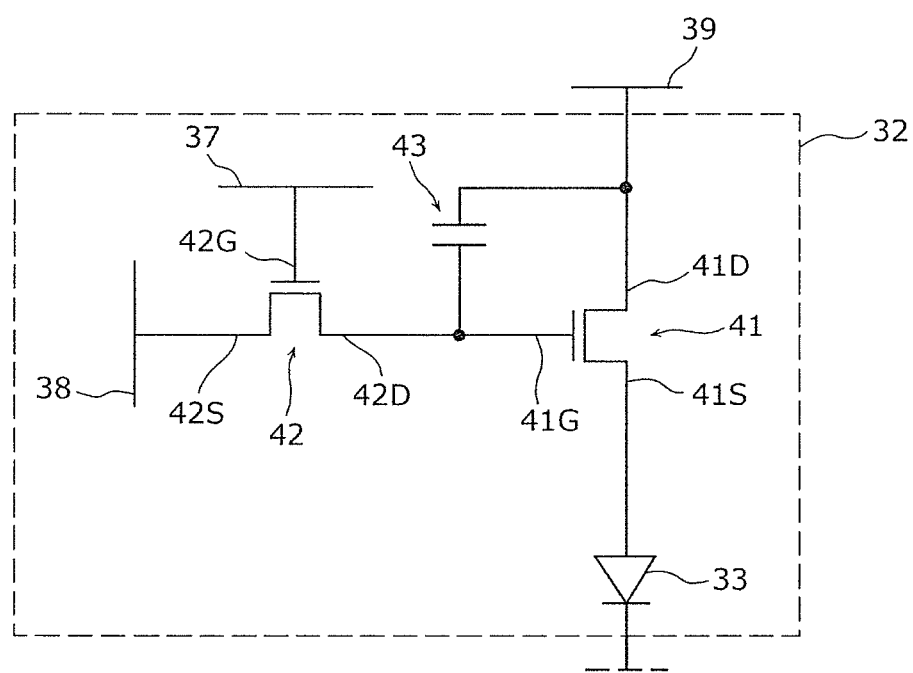
FIG. 18 is a circuit configuration diagram of a pixel using a thin-film semiconductor device for display according to Embodiment 3 of the present invention.

Next, a circuit configuration of the pixel 32 in the above described organic EL display apparatus 30 will be described with reference to FIG. 18. FIG. 18 is a circuit configuration diagram of a pixel using a thin-film semiconductor device according to Embodiment 3 of the present invention.

As shown in FIG. 18, each of the pixels 32 is segmented by the gate line 37 and the source line 38 that cross each other. The pixel 32 includes a driving transistor 41, a switching transistor 42, an organic EL device 33, and a capacitor 44. The driving transistor 41 is a transistor for driving the organic EL device 33, and the switching transistor 42 is a transistor for selecting one of the pixels 32.

In the driving transistor 41, a gate electrode 41G is connected to a drain electrode 42D in the switching transistor 42, a source electrode 41S is connected to an anode of the organic EL device 33 via a relay electrode (not illustrated), and a drain electrode 41D is connected to a power source line 39.

Moreover, in the switching transistor 42, the gate electrode 42G is connected to a scanning line 37, the source electrode 42S is connected to a video signal line 38, the drain electrode 42D is connected to the capacitor 43 and the gate electrode 41G of the driving transistor 41.

In this configuration, when a gate signal is inputted into the gate line 37 and the switching transistor 42 is ON, a video signal voltage is written into the capacitor 43 via the source line 38. The video signal voltage written into the capacitor 43 is stored through a frame period. With the stored video signal voltage, the conductance of the driving transistor 41 is converted in an analogous manner, and the driving current corresponding to light emission gradation flows from the anode to the cathode of the organic EL device 33, and the organic EL device 33 emits light. With this, a predetermined image can be displayed.

The display apparatus according to the embodiments of the present invention has been described. However, the present invention is not limited to such. For example, in the present embodiment, the organic EL display apparatus using the organic EL device has been described. However, the present invention is applicable to a display apparatus other display device such as an inorganic EL panel or a liquid crystal display device, in which an active matrix substrate is used.

The display device according to the embodiments of the present invention is applicable to a flat panel display, and a variety of electronic devices having a display panel, such as a television set, a personal computer, and a mobile phone.

As described above, the thin-film semiconductor device and a method for manufacturing the thin-film semiconductor device have been described with reference to the embodiments. However, the present invention is not limited to the above described embodiments. Those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The thin-film semiconductor device according to the present invention is widely applicable to display apparatuses such as a television set, a personal computer, a mobile phone, or electric appliances including the thin-film semiconductor device.

REFERENCE SIGNS LIST

1 Substrate
2, 41G, 42G Gate electrode
3 Gate insulating film
4, 4B, 104 Semiconductor layer
4a, 4b Non-crystalline silicon thin film
4p, 4a Crystalline silicon thin film
5, 105 Channel protective layer
5F Channel protective layer film
6 Interfacial layer
7 Contact layer
7F Contact layer film
7A Non-crystalline silicon layer
8s, 41S, 42S Source electrode
8d, 41D, 42D Drain electrode
8F Source-drain metal film
10, 10A, 10B, 10c, 100 Thin-film semiconductor device
30 Organic EL display apparatus
31 Active matrix substrate
32 Pixel
33 Organic EL device
34 Anode
35 Organic EL layer
36 Cathode
37 Gate line
38 Source line
39 Power source line
41 Driving transistor
42 Switching transistor
43 Capacitor

The invention claimed is:

1. A thin-film semiconductor device comprising:
a gate electrode above a substrate;
a gate insulating film which covers the gate electrode;
a semiconductor layer above the gate insulating film, the semiconductor layer having a channel region;
a protective layer above the semiconductor layer, the protective layer containing an organic material which includes silicon, oxygen, and carbon;
an interfacial layer in contact with the protective layer between the semiconductor layer and the protective layer, the interfacial layer including carbon as a major component, the carbon originating from the organic material; and
a source electrode and a drain electrode which are electrically connected to the semiconductor layer,
wherein the interfacial layer includes sulfur.

2. The thin-film semiconductor device according to claim 1,
wherein a concentration of sulfur included in the interfacial layer is greater than or equal to 5×1019 [atoms/cm3].

3. The thin-film semiconductor device according to claim 1,
wherein resistivity of the interfacial layer is greater than or equal to 2×106 [Ω·cm].

4. The thin-film semiconductor device according to claim 1,
wherein a thickness of the interfacial layer is from 1 nm to 5 nm.

5. The thin-film semiconductor device according to claim 1,
wherein a concentration of sulfur included in the interfacial layer is 100 times or more higher than a concentration of sulfur as impurity included in the semiconductor layer.

6. The thin-film semiconductor device according to claim 1,
wherein the interfacial layer has a higher density than the protective layer.

7. The thin-film semiconductor device according to claim 1
wherein a concentration of carbon included in the interfacial layer is 50 times or more higher than a concentration of carbon as impurity included in the semiconductor layer.

8. The thin-film semiconductor device according to claim 1
wherein the semiconductor layer is one of an oxide semiconductor and a crystalline silicon thin film.

9. A method for manufacturing a thin-film semiconductor device, the method comprising:
preparing a substrate;
forming a gate electrode above the substrate;
forming a gate insulating film to cover the gate electrode;
forming a semiconductor layer above the gate insulating film, the semiconductor layer having a channel region;
forming a protective layer above the semiconductor layer by applying an organic material including silicon, oxygen, and carbon;
forming, by baking the protective layer, an interfacial layer, in contact with the protective layer, between the semiconductor layer and the protective layer, the interfacial layer including carbon as a major component, the carbon originating from the organic material; and
forming a source electrode and a drain electrode which are electrically connected to the semiconductor layer,
wherein the interface layer includes sulfur.

10. The method for manufacturing a thin-film semiconductor device according to claim 9,
wherein a concentration of sulfur included in the interfacial layer is greater than or equal to 5×1019 [atoms/cm3].

11. The method for manufacturing a thin-film semiconductor device according to claim 9,
wherein resistivity of the interfacial layer is greater than or equal to 2×106 [Ω·cm].

12. The method for manufacturing a thin-film semiconductor device according to claim 9,
wherein a thickness of the interfacial layer is from 1 nm to 5 nm.

13. The method for manufacturing thin-film semiconductor device according to claim 9,
wherein a concentration of sulfur included in the interfacial layer is 100 times or more higher than a concentration of sulfur as impurity included in the semiconductor layer.

14. The method for manufacturing a thin-film semiconductor device according to claim 9,
wherein the interfacial layer has a higher density than the protective layer.

15. The method for manufacturing a thin-film semiconductor device according to claim 9,
wherein a concentration of carbon included in the interfacial layer is 50 times or more higher than a concentration of carbon as impurity included in the semiconductor layer.

16. The method for manufacturing a thin-film semiconductor device according to claim 9,
wherein the semiconductor layer is one of an oxide semiconductor and a crystalline silicon thin film.

17. The method for manufacturing a thin-film semiconductor device according to claim 9,
wherein the semiconductor layer is a crystalline silicon thin film,
an organic material included in the protective layer is removed with hydrogen plasma treatment, and
the method further comprises, before the protective layer and the interfacial layer are formed, performing of a hydrogenation process with the hydrogen plasma treatment on the channel region included in the crystalline silicon thin film.

18. A method for manufacturing a thin-film semiconductor device, the method comprising:
preparing a substrate;
forming a gate electrode above the substrate;
forming a gate insulating film to cover the gate electrode;
forming a crystalline silicon thin film above the gate insulating film, the crystalline silicon thin film having a channel region;
foaming a protective layer above the channel region by applying an organic material including carbon; and
forming a source electrode and a drain electrode above the crystalline silicon thin film,
wherein an organic material contained in the protective layer is removed with hydrogen plasma treatment, and
the method further comprises, between the forming of a crystalline silicon thin film and the forming of a protective layer, performing of a hydrogenation process on the crystalline silicon thin film with hydrogen plasma.

* * * * *